(12) United States Patent
Rinaldi et al.

(10) Patent No.: US 9,705,469 B2
(45) Date of Patent: Jul. 11, 2017

(54) NANO- AND MICRO-ELECTROMECHANICAL RESONATORS

(71) Applicant: Northeastern University, Boston, MA (US)

(72) Inventors: Matteo Rinaldi, Boston, MA (US); Zhenyun Qian, Boston, MA (US); Yu Hui, Billerica, MA (US)

(73) Assignee: Northeastern University, Boston, MA (US)

(*) Notice: Subject to any disclaimer, the term of this patent is extended or adjusted under 35 U.S.C. 154(b) by 0 days.

(21) Appl. No.: 15/240,356

(22) Filed: Aug. 18, 2016

(65) Prior Publication Data

US 2017/0163240 A1 Jun. 8, 2017

Related U.S. Application Data

(62) Division of application No. 14/784,876, filed as application No. PCT/US2014/035015 on Apr. 22, 2014, now Pat. No. 9,425,765.

(60) Provisional application No. 61/814,744, filed on Apr. 22, 2013, provisional application No. 61/814,742, filed on Apr. 22, 2013, provisional application No. 61/828,227, filed on May 29, 2013.

(51) Int. Cl.
| | | |
|---|---|---|
| H03H 9/02 | (2006.01) |
| H03H 9/13 | (2006.01) |
| H03H 9/15 | (2006.01) |
| G01J 5/44 | (2006.01) |
| H03H 9/17 | (2006.01) |
| G01J 5/04 | (2006.01) |
| H03H 3/02 | (2006.01) |
| H01L 41/18 | (2006.01) |
| H03H 9/24 | (2006.01) |

(52) U.S. Cl.
CPC ......... *H03H 9/02244* (2013.01); *G01J 5/046* (2013.01); *G01J 5/44* (2013.01); *H01L 41/18* (2013.01); *H03H 3/02* (2013.01); *H03H 9/13* (2013.01); *H03H 9/15* (2013.01); *H03H 9/17* (2013.01); *H03H 2003/027* (2013.01); *H03H 2009/155* (2013.01); *H03H 2009/241* (2013.01)

(58) Field of Classification Search
CPC ...... G01J 5/046; G01J 5/44; H03H 2003/027; H03H 2009/155; H03H 2009/241; H03H 3/02; H03H 9/02244; H03H 9/13; H03H 9/15; H03H 9/17
See application file for complete search history.

(56) References Cited

PUBLICATIONS

Hui et al., "Ultra-Fast and High Resolution NEMS Thermal Detector Based on a Nano-Air-Gap Piezoelectric Resonant Structure", Electrical and Computer Engineering Faculty Publications, Northeastern University, Oct. 28, 2012, pp. 1-4.*

* cited by examiner

*Primary Examiner* — Mark R Gaworecki
(74) *Attorney, Agent, or Firm* — Posternak Blankstein & Lund LLP

(57) ABSTRACT

A resonator including a piezoelectric plate and an interdigital electrode is provided. A ratio between a thickness of the plate and a pitch of the interdigital electrode may be from about 0.5 to about 1.5. A radiation detector including a resonator and an absorber layer capable of absorbing at least one of infrared and terahertz radiation is provided. A resonator including a piezoelectric plate and a two-dimensional electrically conductive material is provided.

9 Claims, 33 Drawing Sheets

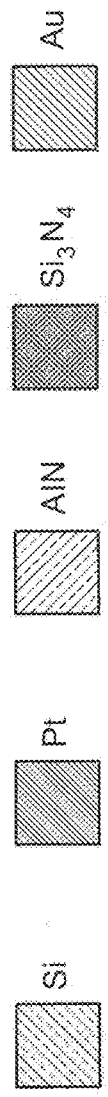
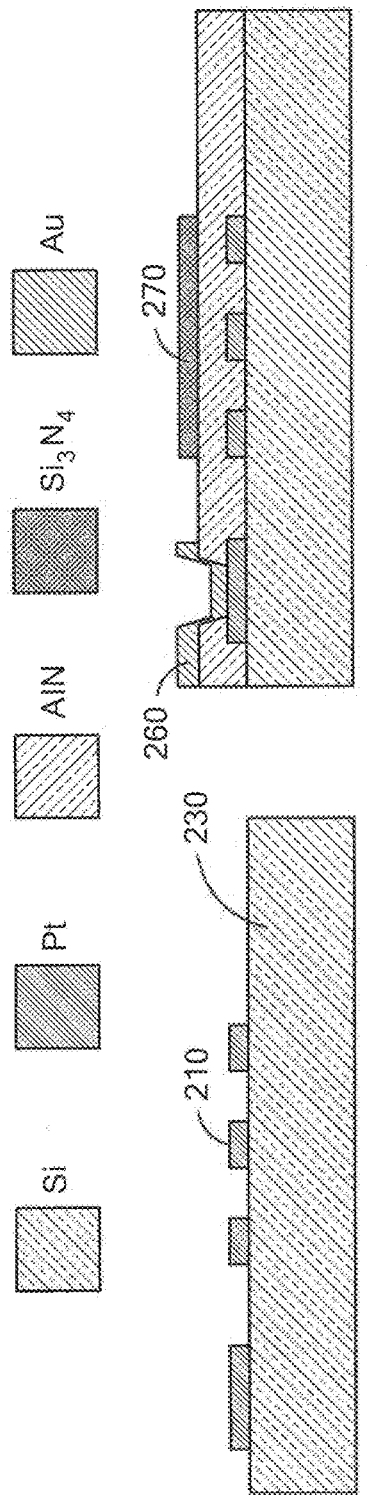
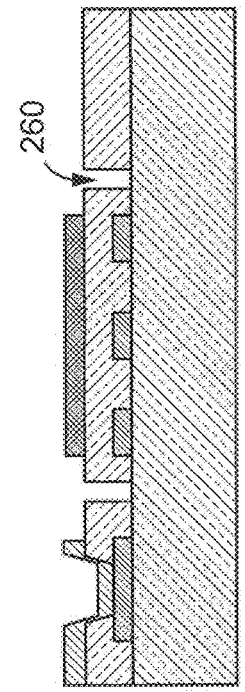
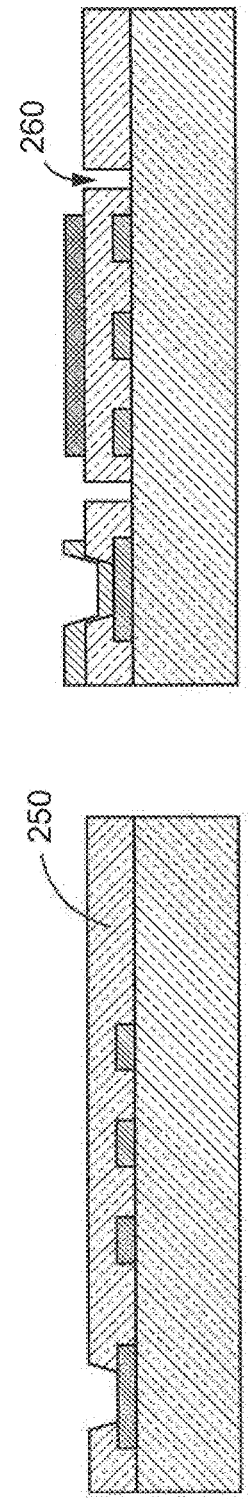
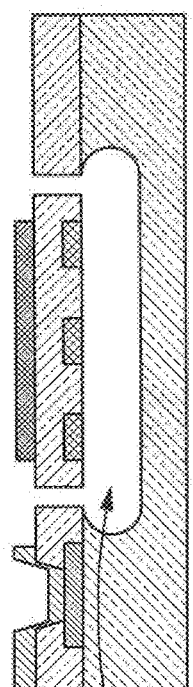
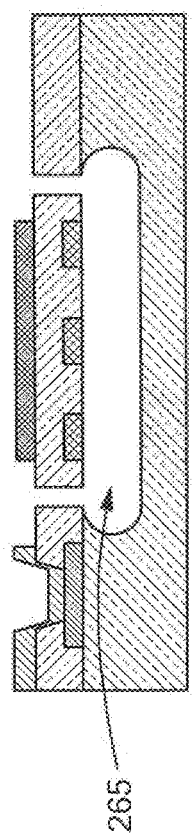

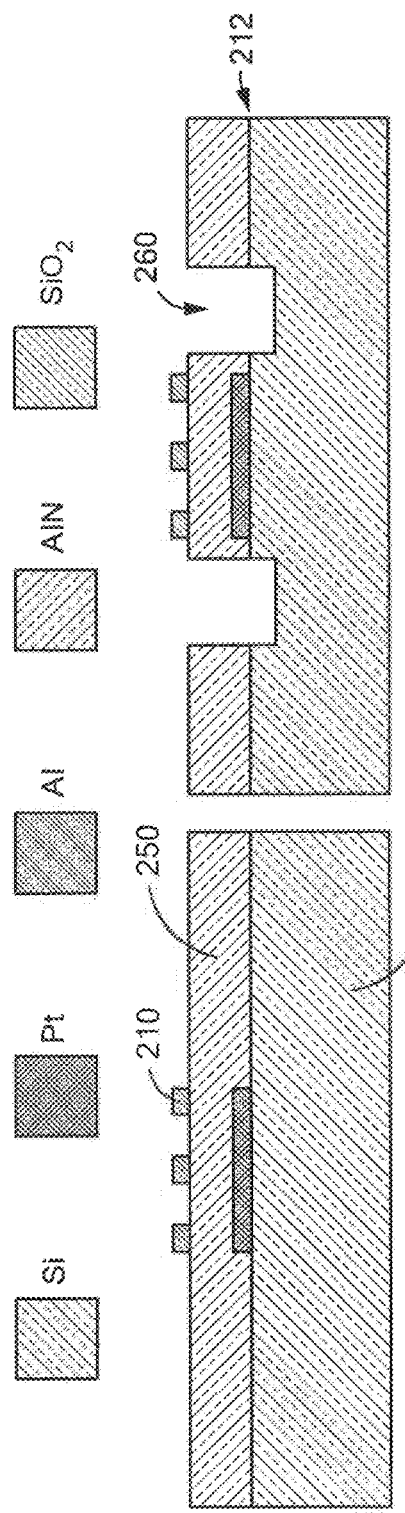
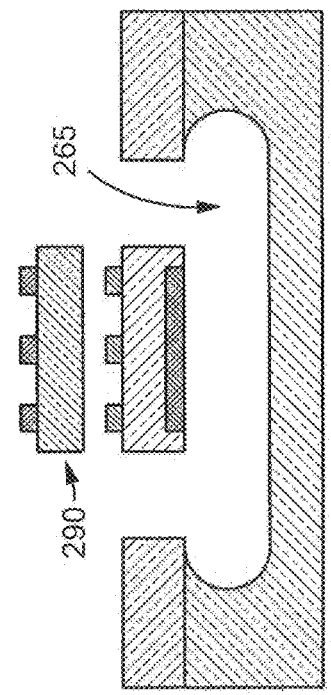
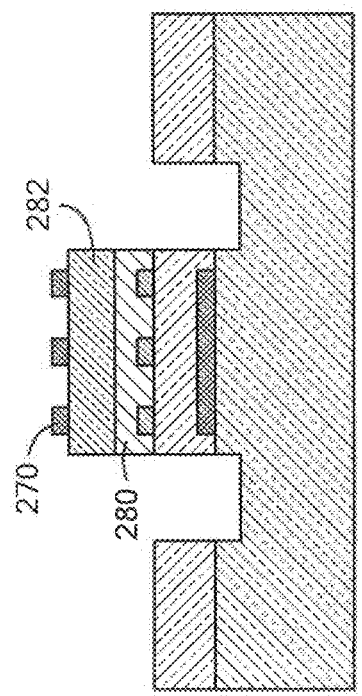
Figure 19(a)
Figure 19(b)
Figure 19(c)
Figure 19(d)

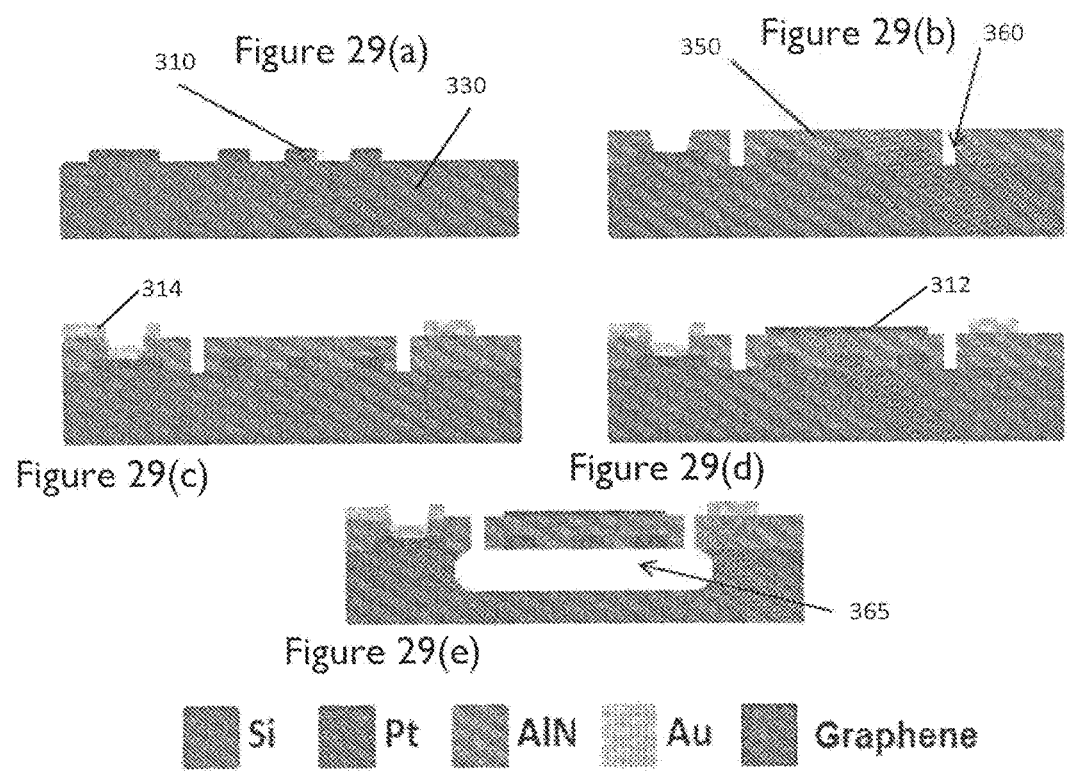

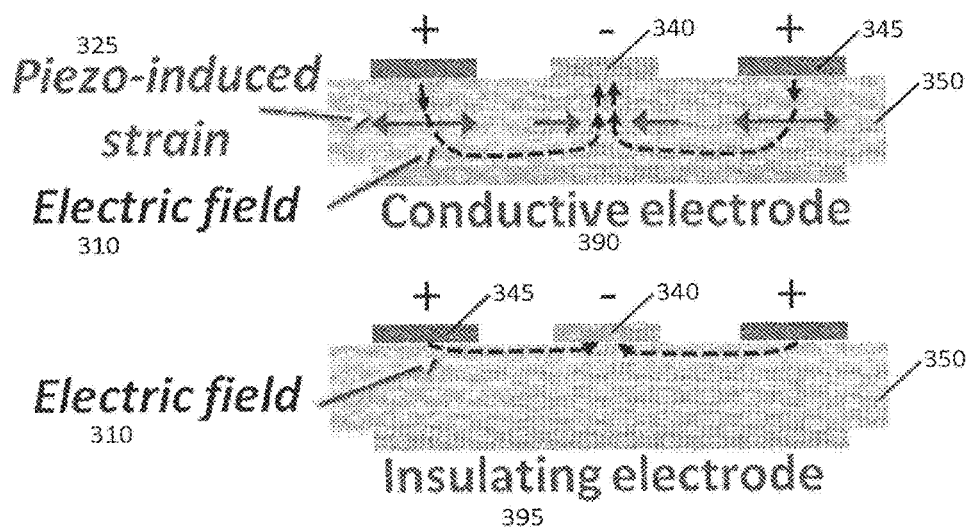

NANO- AND MICRO-ELECTROMECHANICAL RESONATORS

RELATED APPLICATIONS

This application is a divisional application of U.S. application Ser. No. 14/784,876, filed on Oct. 15, 2015, which is a U.S. National Stage of International Application No. PCT/US2014/035015, filed Apr. 22, 2014, which claims the benefit of and priority to U.S. Provisional Application Ser. No. 61/814,742, filed Apr. 22, 2013; U.S. Provisional Application Ser. No. 61/814,744, filed Apr. 22, 2013; and U.S. Provisional Application Ser. No. 61/828,227, filed May 29, 2013, each of which is hereby incorporated by reference in its entirety.

STATEMENT REGARDING FEDERALLY SPONSORED RESEARCH

This invention was made with government support under Grant No. N66001-12-1-4221, awarded by the DARPA Young Faculty Award and Grant No. DARPA-N66001-14-1-4011 awarded by the DARPA. The United States government has certain rights in this invention.

BACKGROUND

The inclusion of resonators in nano-electromechanical systems (NEMS) and micro-electromechanical systems (MEMS) presents challenges as a result of the low Figure of Merit of pre-existing resonators. Additionally, pre-existing resonators are not fully scalable as a result of design and material limitations that impose a lower limit on resonator feature size. These issues preclude the employment of pre-existing resonators in many applications.

SUMMARY

In view of the foregoing, the present Inventors have recognized and appreciated the advantages of a resonator with the features described herein to be employed in nano-electromechanical systems (N EMS) and/or micro-electromechanical systems (MEMS).

Accordingly, provided according to one embodiment herein is a resonator including a piezoelectric plate and an interdigital electrode; a ratio between a thickness of the plate and a pitch of the interdigital electrode may be from about 0.5 to about 1.5.

In another embodiment, a resonator including a piezoelectric plate and an interdigital electrode is provided; the resonator may be configured to operate in a combined mode of vibration comprising a thickness-extensional mode and a lateral-extensional mode.

In another embodiment, a method of making a resonator is provided. The method may include disposing a piezoelectric layer over a substrate, disposing a first electrode layer over the piezoelectric layer, patterning the first electrode layer to form an interdigital electrode, etching the piezoelectric layer to form a piezoelectric micro-plate, and releasing the micro-plate from the substrate. The resonator may be configured to operate in a combined mode of vibration comprising a thickness-extensional mode and a lateral-extensional mode.

Provided in another embodiment is a radiation detector including a resonator and an absorber layer. The absorber layer may be capable of absorbing at least one of infrared and terahertz radiation.

In another embodiment, a method of making a radiation detector is provided. The method may include disposing a first electrode over a substrate, disposing a piezoelectric layer over the substrate and first electrode, disposing a second electrode over the piezoelectric layer, disposing an absorber layer over the piezoelectric layer, etching the piezoelectric layer to form a piezoelectric nano-plate, and releasing the nano-plate from the substrate.

In another embodiment, a device including a resonator integrated with an absorber layer capable of absorbing at least one of infrared and terahertz radiation is provided. The device may be configured to carry out at least one of imaging and spectroscopy.

Provided in another embodiment is a resonator including a piezoelectric plate and an electrode comprising a two-dimensional electrically conductive material.

In another embodiment, a method of making a resonator is provided. The method may include disposing a first electrode over a substrate, disposing a piezoelectric layer over the substrate and first electrode, disposing a second electrode comprising a two-dimensional electrically conductive material over the piezoelectric layer, etching the piezoelectric layer to form a piezoelectric nano-plate, and releasing the nano-plate from the substrate.

In another embodiment, a method of operating a resonator is provided. The method may include applying at least one of a direct current bias and a control signal to the resonator. The resonator may include a piezoelectric plate and an electrode comprising a two-dimensional electrically conductive material.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 18(a)-18(e) are representations of the steps in the manufacture of an infrared detector including an AlN resonator and an infrared absorber layer, according to one embodiment.

FIGS. 19(a)-19(d) are representations of the steps in the manufacture of a IR/THz detector including an AlN resonator and a IR/THz absorber layer, according to one embodiment.

FIGS. 29(a)-29(e) illustrate the steps in the manufacture of a graphene containing AlN resonator, according to one embodiment.

FIGS. 31(a) and 31(b) are schematic representations of nano-plate resonators including a 2D electrically conductive electrode in a conductive state and a non-conductive state, respectively, according to one embodiment.

DETAILED DESCRIPTION

Figure 1:
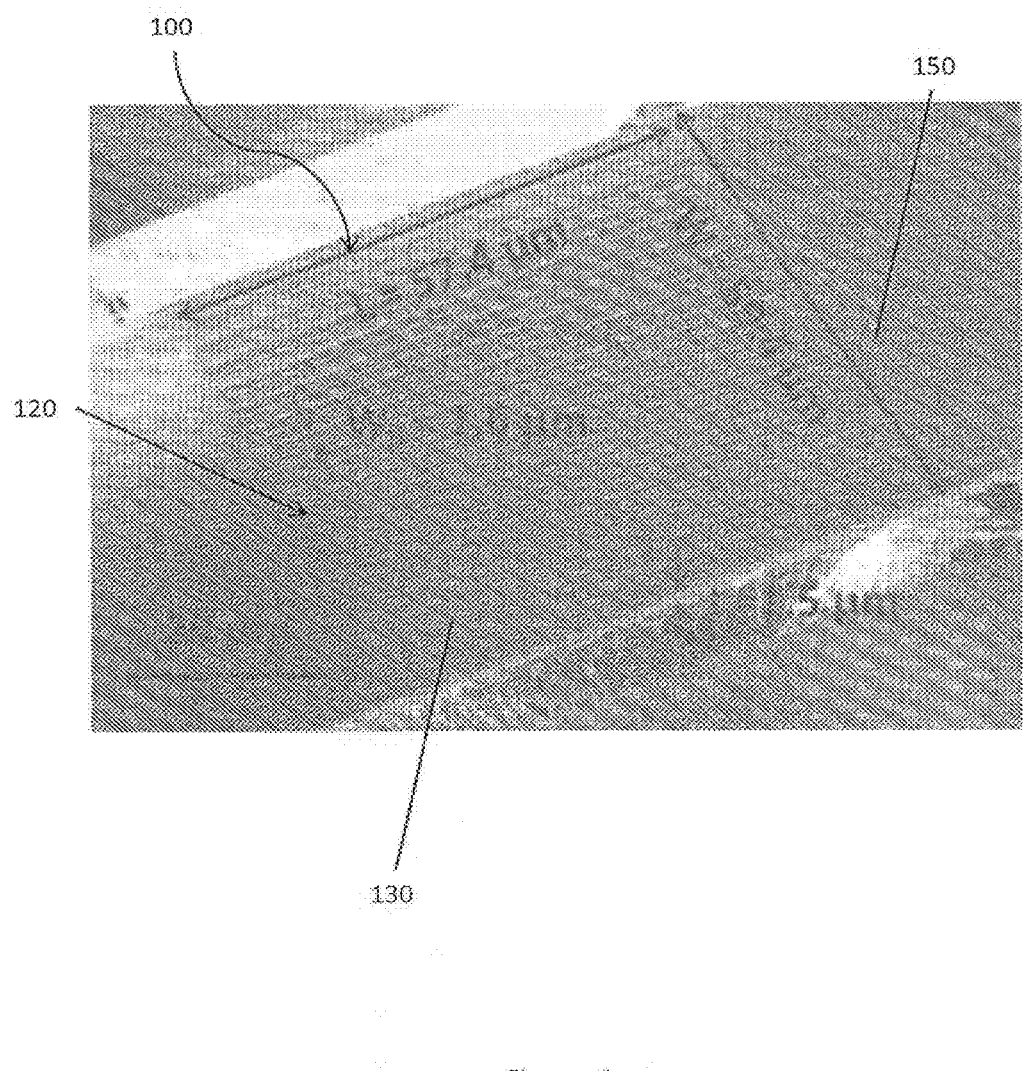
FIG. 1 depicts an SEM image of an AlN combined mode MEMS resonator, according to one embodiment.

Following below are more detailed descriptions of various concepts related to, and embodiments of, micro-electromechanical resonators and methods of producing the same. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Aluminum Nitride Resonator

Aluminum nitride (AlN) contour mode resonator (CMR) high frequency micro-electro-mechanical systems (MEMS) may be valuable for the applications in the fields of radio frequency (RF) communication and physical and chemical sensing at least as a result of high quality factor, low motional resistance, complementary metal-oxide-semiconductor (CMOS) compatibility and desirable scaling capabilities. The electromechanical coupling coefficient ($k_t^2$), which according to one embodiment is a measure of the conversion efficiency between electrical and acoustic energy in piezoelectric materials, of an AlN contour-mode MEMS resonators may be relatively low: according to one embodiment typically lower than 1.5% for single interdigital electrode excited (lateral field excitation (LFE)) high frequency contour-extensional mode AlN MEMS resonators. According to one embodiment, the CMR technology exhibits the same advantages of thin film bulk acoustic resonators (FBARs) over SAW devices in terms of miniaturization and IC integration capabilities. Nevertheless, the CMR technology employs the $d_{31}$ piezoelectric coefficient of AlN to transduce a lateral-extensional mode of vibration, in contrast to FBARs, which use the $d_{33}$ piezoelectric coefficient of AlN to transduce a thickness-extensional mode in the micromechanical structure. Therefore, according to one embodiment the operating frequency of CMRs may be lithographically determined by the lateral dimensions of the device (rather than by the thickness of the AlN layer as in the FBAR case), enabling the fabrication of multiple frequencies of operation on the same silicon chip. This is an important feature for advanced wireless communication systems, for which at least in one instance single-chip, multi-band RF solutions are becoming the dominant trend.

The Figure of Merit of a resonator according to one embodiment is defined as the product of the quality factor (Q) and $k_t^2$. The Figure of Merit may directly determine the motional resistance in any resonator, impact oscillator design by setting the required gain (i.e. power consumption) and phase noise of oscillator, and impact filter design by setting insertion loss in properly terminated filters and device bandwidth.

The resonators may be part of nano-electromechanical or micro-electromechanical systems. According to one embodiment, the resonator may be a plate type resonator. The plate may have any suitable dimensions. Depending on the geometry of the resonator, the term "dimension" may refer to any dimension of interest in the resonator. For example, the dimension may refer to thickness, width, height, length, diameter, radius, etc. According to one embodiment, the dimension may refer to the thickness of the plate. According to one embodiment, the plate may have a thickness of less than or equal to about 10 microns—e.g., less than about 9 microns, about 8 microns, about 7 microns, about 6 microns, about 5 microns, about 4 microns, about 3 microns, about 2 microns, about 1 micron, about 900 nm, about 800 nm, about 700 nm, about 600 nm, about 500 nm, about 400 nm, about 300 nm, about 200 nm, about 100 nm, or less. According to another embodiment, the plate is a nano-plate, referring to a plate whose largest dimension is in the nanometer range, such as less than or equal to about 1 micron, or any of the aforedescribed values with respect to dimension. According to another embodiment, nano-plate may refer to a plate with at least one dimension in the nanometer range, such as less than or equal to about 1 micron, or any of the aforedescribed values with respect to dimension. According to another embodiment, the plate is a micro-plate, referring to a plate whose largest dimension is in the micrometer range, such as less than or equal to about 1 mm. According to another embodiment, micro-plate may refer to a plate with at least one dimension in the micrometer range, such as less than or equal to about 1 mm.

The plate may include any suitable piezoelectric material. According to one embodiment, the plate may include a compound, such as a nitride, such as an aluminum nitride (AlN). According to another embodiment, the plate a may include at least one of aluminum nitride, lithium niobate, lithium tantalate, zinc oxide, gallium nitride and quartz. The electrodes of the resonator may include any suitable material. According to one embodiment, the electrodes may include a metal, such as a noble metal, such as platinum or gold.

Combined Mode of Vibration Resonator

Figure 2A:
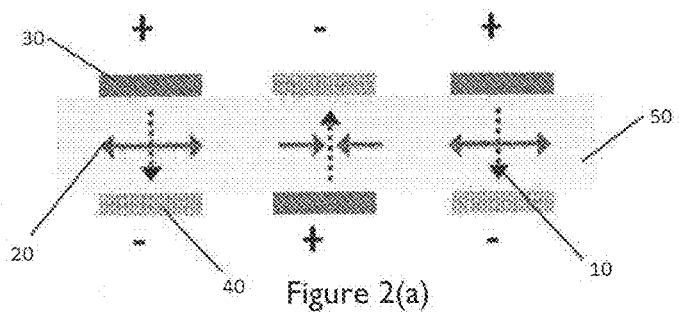
FIGS. 2(a) and 2(b), respectively, are schematic representations of thickness field excitation and lateral field excitation of contour mode resonators, according to one embodiment.

The performance of an electromechanical resonator is in general evaluated in terms of Figure of Merit (FOM), defined as the product of the quality factor (Q) and the electromechanical coupling coefficient ($k_t^2$) of the resonator. A high Q>2000 may generally be achieved in high frequency AlN CMRs, while only limited values of $k_t^2$ have been demonstrated for this type of device due at least in part to the relatively small value of the $d_{31}$ piezoelectric coefficient of AlN employed to excite the contour-extensional mode of vibration. By contrast, FBAR devices may exhibit higher values of $k_t^2$~6% at least because the $d_{33}$ piezoelectric coefficient may be more than twice as large as the $d_{31}$ coefficient. Furthermore, such piezoelectric coefficient-limited values of $k_t^2$ may be achieved by maximizing the confinement of the excitation electric field across the thickness of the AlN layer, through the use of a thickness field excitation (TFE) scheme involving a top and a bottom electrodes produced utilizing a 4-mask fabrication process. FIG. 2(a) depicts a TFE scheme according to one embodiment, in which positive electrodes 30 and negative electrodes 40 are present on either side of a piezoelectric plate 50, such that an electric field 10 is established between the electrodes, producing an in-plane displacement 20 of the piezoelectric material.

Figure 2B:
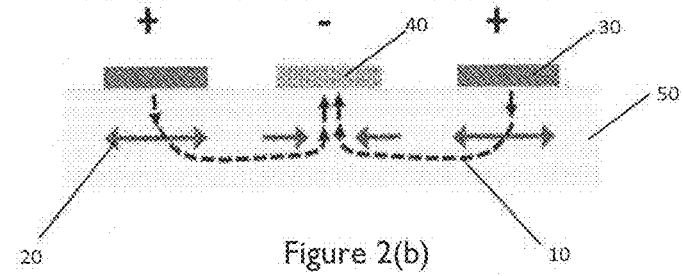

Lateral field excitation (LFE) schemes allow the use of a single interdigital electrode on the AlN plate. Such an LFE configuration may simplify the fabrication of the device by utilizing a 2-mask fabrication process. FIG. 2(b) depicts an LFE scheme in which positive electrodes 30 and negative electrodes 40 are present on one side of a piezoelectric plate 50 such that an electric field 10 is established between the electrodes producing an in-plane displacement 20 of the piezoelectric material. Furthermore, operation in the super-high frequency band (e.g., up to about 9.9 GHz) and values of Q as high as about 2200 have been demonstrated using LFE. Pre-existing LFE schemes may produce relatively low values of $k_t^2$<1.5%, as a result of the reduced confinement of the excitation electric field across the thickness of the AlN layer.

A pre-existing LFE CMR is composed of a simple two-layer structure, in which an interdigital metal electrode is deposited on an AlN plate. When an AC signal is applied to the top interdigital electrode, a contour-extensional mode of vibration may be excited through the equivalent $d_{31}$ piezoelectric coefficient of AlN. Given the equivalent mass density, $\rho_{eq}$, and Young's modulus, $E_{eq}$, of the material stack that forms the resonator, the center frequency, $f_0$, of this laterally vibrating mechanical structure, may be determined by the pitch, W, of the interdigital electrode.

A combined mode of vibration resonator may allow a high operating frequency (~2.8 GHz), quality factor (Q~4855) and electromechanical coupling coefficient ($k_t^2$~2.48%) to be simultaneously demonstrated in an LFE AlN MEMS resonator. The thickness and lateral dimensions of the resonator may be designed to transduce a single mechanical combined mode of vibration based on the coherent combination of the $d_{31}$ and the $d_{33}$ piezoelectric coefficients of AlN. Such a combination of piezoelectric coefficients produces an enhanced $k_t^2$ of the device resulting in a 2.8 GHz LFE AlN MEMS resonator with unprecedentedly high FOM~46 with the use of a single interdigital top-electrode produced utilizing a simple 2-mask fabrication process. The pitch, W, of the interdigital electrode and a thickness, T, of the AlN layer of the combined mode resonator may be selected in order to excite a single mechanical mode of vibration based on the coherent combination of $d_{31}$ and $d_{33}$ piezoelectric coefficients to maximize the electromechanical coupling coefficient of the device.

Figure 3:
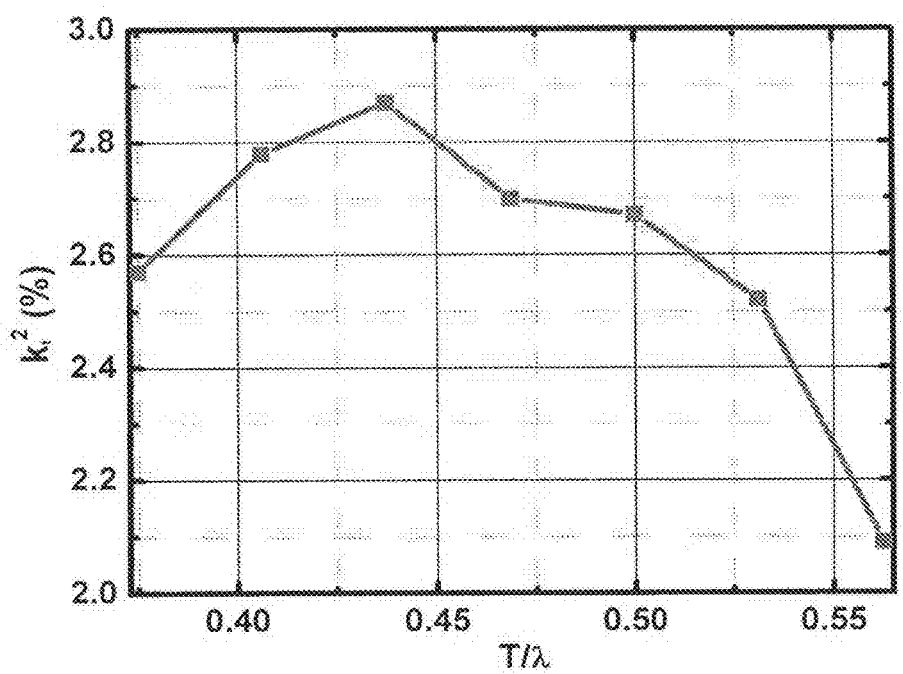
FIG. 3 depicts the electromechanical coupling coefficient of an AlN lateral field excitation resonator according to one embodiment, employing a single top interdigital electrode as a function of the ratio of the thickness of the AlN resonator to the wavelength.
Figure 4:
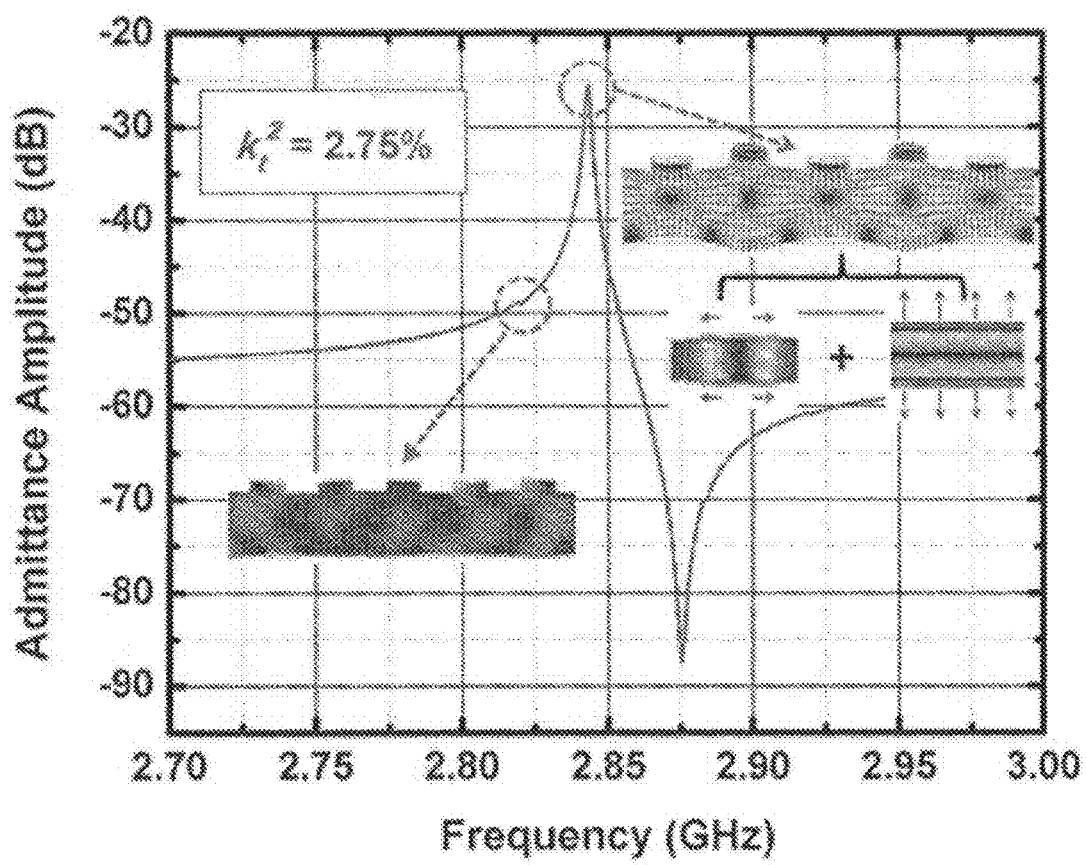
FIG. 4 depicts the admittance amplitude of a lateral field excitation combined mode AlN resonator as a function of frequency, according to one embodiment.

The $k_t^2$ dependence on the thickness, T, of the AlN resonator for a given value of the interdigital electrode pitch, W, hence wavelength, $\lambda$, as $\lambda=2$ W was investigated. As shown in FIG. 3, high values of $k_t^2$>2.5% (~twice the best values achievable with pre-existing LFE AlN CMRs) may be achieved for T/$\lambda$ values ranging between about 0.35 and about 0.55 for which $d_{31}$ and the $d_{33}$ piezoelectric coefficients are coherently exploited to excite a single combined lateral-thickness extensional mode of vibration. The data indicate that the electromechanical coupling coefficient of combined mode resonators may reach about 3%. The admittance curve and the corresponding 2D mode shape of vibration for T/λ=0.47 are shown in FIG. 4. The result shows that, at the resonance frequency, the lateral-extensional and thickness-extensional modes are combined into a single mechanical mode of vibration with an enhanced electromechanical coupling coefficient, $k_t^2$ 2.78%. A spurious vibration mode at a frequency slightly lower than the resonance frequency may also be observed.

The resonator may have any appropriate plate thickness to interdigital electrode pitch ratio (T/W) for a combined mode of vibration. According to one embodiment, the resonator exhibits a thickness to interdigital electrode pitch ratio of about 0.5 to about 1.5—e.g., about 0.6 to about 1.4, about 0.7 to about 1.3, about 0.8 to about 1.2, about 0.9 to about 1.1, etc. According to another embodiment, the resonator may be configured to operate in a combined mode of vibration, such as a combined mode of vibration in which at least both the $d_{31}$ and $d_{33}$ piezoelectric coefficients contribute to the electromechanical coupling coefficient of the resonator.

The resonator may have any appropriate electromechanical coupling coefficient. According to one embodiment, the resonator exhibits an electromechanical coupling coefficient of at least about 1.5%—e.g., at least about 1.6%, about 1.7%, about 1.8%, about 1.9%, about 2%, about 2.1%, about 2.2%, about 2.3%, about 2.4%, about 2.5%, or more.

The resonator may have any appropriate quality factor. According to one embodiment, the resonator exhibits a quality factor of at least about 1600—e.g., at least about 1700, about 1800, about 1900, about 2000, about 2100, about 2200, or more.

The resonator may be configured to resonate at any appropriate frequency. According to one embodiment, the resonator resonates at a frequency of at least about 10 MHz—e.g., at least about 50 MHz, about 100 MHz, about 200 MHz, about 300 MHz, about 400 MHz, about 500 MHz, about 600 MHz, about 700 MHz, about 800 MHz, about 900 MHz, or higher. According to another embodiment, the resonator resonates at a frequency of about 10 MHz to about 100 GHz—e.g., about 50 MHz to about 90 GHz, about 100 MHz to about 80 GHz, about 200 MHz to about 70 GHz, about 300 MHz to about 60 GHz, about 400 MHz to about 50 GHz, etc.

Not to be bound by any theory, but the combined vibration mode may improve the Figure of Merit of AlN MEMS resonators by increasing the electromechanical coupling coefficient ($k_t^2$) while preserving a high quality factor (Q), thereby enabling the implementation of high performance, miniaturized and high frequency AlN MEMS resonators. The combined vibration mode may produce a device with a Figure of Merit of at least about 40—e.g., at least about 45, about 50, about 55, about 60, or higher. The high Figure of Merit of the combined mode of vibration AlN MEMS resonators allows the implementation of low motional resistance MEMS resonators, high gain (low power consumption) self-sustained and compact MEMS-CMOS oscillators and low insertion loss MEMS filters. The high Figure of Merit allows the device motional resistance ($R_m$) to be significantly reduced. According to one embodiment, the resonator exhibits a motional resistance of about 15Ω, which is much smaller than that of pre-existing AlN contour-mode resonators working in the GHz range that exhibit typical motional resistances of ~100s Ω. According to one embodiment, the resonator may exhibit a motional resistance of less than or equal to about 100Ω—e.g., less than or equal to about 90Ω, about 80Ω, about 70Ω, about 60Ω, about 50Ω, about 40Ω, about 30Ω, about 20Ω, about 15Ω, or less. Pre-existing AlN contour-mode resonators working in the GHz range exhibit Figures of Merit below about 30. The improved Figure of Merit of the resonators described herein, as compared with the pre-existing technology, may allow the development of high performance (low power consumption, low insertion loss and compact) devices, such as MEMS-CMOS oscillators and band-pass filters, based on the combined mode AlN MEMS resonators.

The resonators described herein may be fabricated by any appropriate process. According to one embodiment, the resonators may be fabricated by a simplified two-mask microfabrication process. The fabrication process may include: disposing a piezoelectric layer over a substrate, disposing a first electrode layer over the piezoelectric layer, patterning the first electrode layer to form an interdigital electrode, etching the piezoelectric layer to form a piezoelectric micro-plate, and releasing the micro-plate from the substrate. The substrate may comprise, or be, any suitable material, such as silicon. According to one embodiment, the substrate may be a silicon wafer. According to one embodiment, the disposing of the piezoelectric layer may include any suitable process, such as a sputter deposition process. The piezoelectric layer may include any suitable material, such as the aforedescribed piezoelectric materials. According to one embodiment, the disposing of the first electrode layer may include any suitable process, such as a sputter deposition process. According to one embodiment, the patterning of the first electrode layer to form an interdigital electrode may include any suitable process, such as a lift-off process. According to one embodiment, the etching of the piezoelectric layer to form a piezoelectric micro-plate may include any suitable process, such as an ion conductive plasma (ICP) process. The forming of the micro-plate may include forming a perimeter of the nano-plate. According to one embodiment, the releasing the piezoelectric layer from the substrate may include any suitable process, such as an isotropic etching process.

Figure 5:
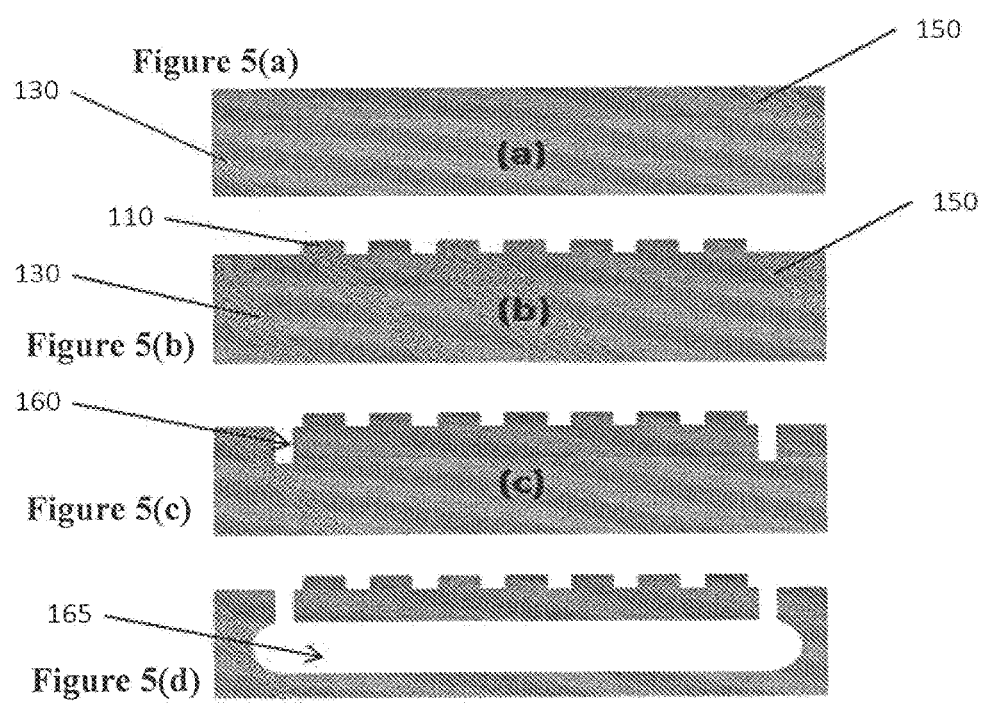
FIGS. 5(a)-(d) are representations of the steps in the manufacture of an AlN combined mode MEMS resonator, according to one embodiment.

An AlN resonator with T/λ=0.47 was designed and fabricated. The pitch 120, W, of the interdigital electrode was set to 1.6 μm, and the thickness, T, of the AlN was accordingly chosen to be 1.5 μm, producing t/W≈0.94. The AlN resonator was fabricated by a simplified two-mask microfabrication process. As depicted in FIG. 5(a), a 1.5 μm thick AlN film 150 was sputter-deposited on top of a high resistivity silicon wafer substrate 130. Then, a 200/50 nm thick Al/TiN film was deposited on top of the AlN film and patterned by a lift-off process to produce the interdigital electrode 110 as shown in FIG. 5(b). Next, the AlN film was etched by ICP in $Cl_2$ based chemistry to define the perimeter of the resonator by producing gaps 160 in the AlN film as shown in FIG. 5(c). Finally, the silicon substrate underneath the AlN resonator was released by $XeF_2$ isotropic etching producing a release void 165 in the silicon substrate 150 as shown in FIG. 5(d). An SEM image of the fabricated resonator 100 is shown in FIG. 1.

Figure 6:
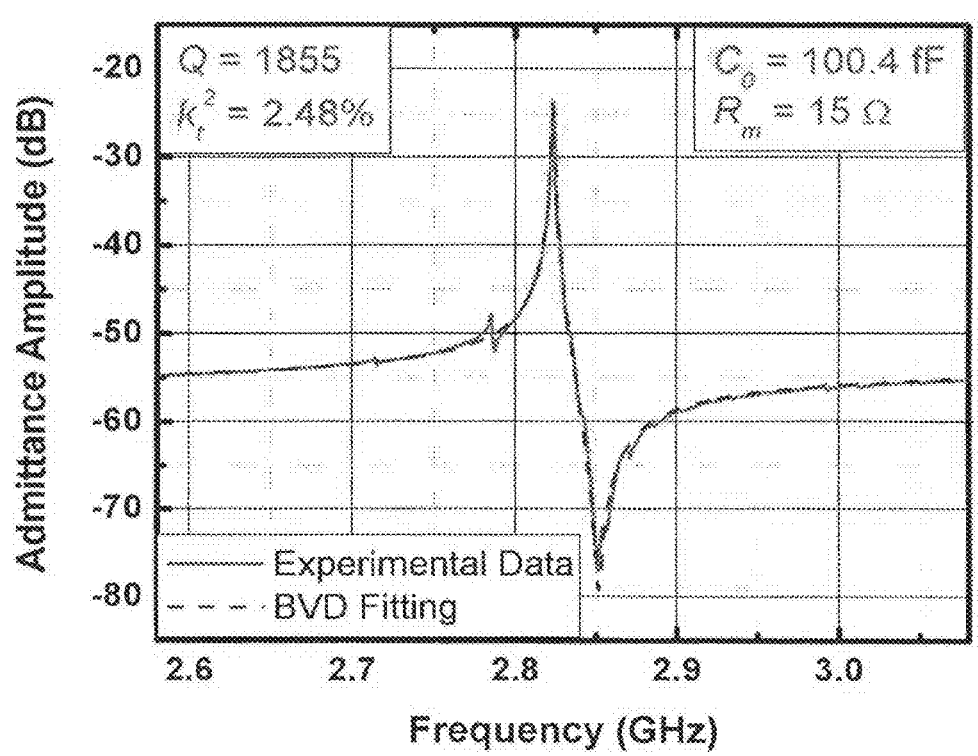
FIG. 6 depicts the admittance amplitude of a lateral field excitation combined mode AlN resonator as a function of frequency, according to one embodiment.

The electrical performance of the fabricated AlN LFE combined mode MEMS resonator was measured by an Agilent E5071C network analyzer after performing an open-short-load calibration. The measured admittance response versus frequency and the Butterworth-van Dyke (BVD) fitting are shown in FIG. 6. A single resonance peak was measured at 2.82 GHz. A high quality factor value, Q of 1855 as a result of the direct deposition of AlN film on a polished silicon substrate and high electromechanical coupling coefficient, $k_t^2 \sim 2.48\%$, as a result of the combined $d_{31}$ and $d_{33}$ piezoelectric coefficients, was achieved. The measured $k_t^2$ of 2.48% and the corresponding FOM~46 are the highest ever reported among LFE AlN MEMS resonators employing a single top interdigital electrode produced utilizing a 2-mask fabrication process. A motional resistance of about 15Ω was measured.

Radiation Detector Including Resonator

Infrared (IR) detectors may be employed in military and space applications, such as night vision, surveillance and targeting and civilian applications, such as health care, automotive, chemical and biological sensing, and telecommunications. IR sensors may be generally divided in two categories: photonic detectors and thermal detectors. Semiconductor photonic detectors exhibit spectrum selectivity, low detection limit and fast response. However, to achieve such performance, cryogenic cooling, which is expensive, bulky, and power consuming, is generally needed in pre-existing processes to prevent the formation of thermally generated carriers. On the other hand, thermal detectors, which have been implemented by bolometers, pyroelectric IR detectors and thermopiles, are less expensive, compact and more power efficient. However, pre-existing thermal detectors cannot rival semiconductor photonic IR detectors in terms of detection limit and response time.

With the recent advances in Micro/Nano-Electro-Mechanical Systems (MEMS/NEMS), uncooled IR thermal detectors based on MEMS/NEMS technology have attracted much attention due to their potentially ultra-high resolution and advantages in terms of size and cost, compared to pre-existing cryogenically cooled semiconductor photon detectors. Micromachined uncooled resonant IR thermal detectors based on gallium nitride and Y-cut-quartz demonstrate promising IR detection capabilities. An ultra-fast, sensitive and miniaturized uncooled NEMS thermal imaging systems is provided based on a high frequency (196.6 MHz) AlN nanomechanical resonant structure. Different from quartz and gallium nitride, ultra-thin (10s nm thick) and high quality AlN piezoelectric films can be deposited by low-temperature sputtering processes directly on silicon substrates, enabling the implementation of CMOS compatible, ultra-miniaturized and high frequency resonant structures with desirable thermal detection capabilities. The scaling capabilities and the desirable transduction properties of AlN at nanoscale allow for the first demonstration of a fast and high resolution IR resonant thermal detector based on a 250 nm thick AlN nano-plate. An ultra-thin $Si_3N_4$ film (100 nm thick) was employed as an IR absorber, resulting in a NEMS resonator IR detector whose resonance frequency is highly sensitive to IR radiation in the 8 to 14 μm spectral range, making it suitable for human tracking applications. The NPR may be configured to be excited in a contour-mode of vibration by piezoelectric transduction, as described above.

The integrated absorber layer on the AlN NPR may be any appropriate material. According to one embodiment, the absorber layer may include a single wall carbon nanotube (SWNT) forest, silicon nitride, graphene or a metamaterial. The metamaterial may be a photonic metamaterial, such as a photonic metamaterial comprising patterned metal or graphene. The selection of the absorber layer may allow the radiation detector to detect infrared radiation, terahertz radiation, or both. According to one embodiment, the absorber layer may also act as a second electrode of the nano-plate resonator.

Figure 7:
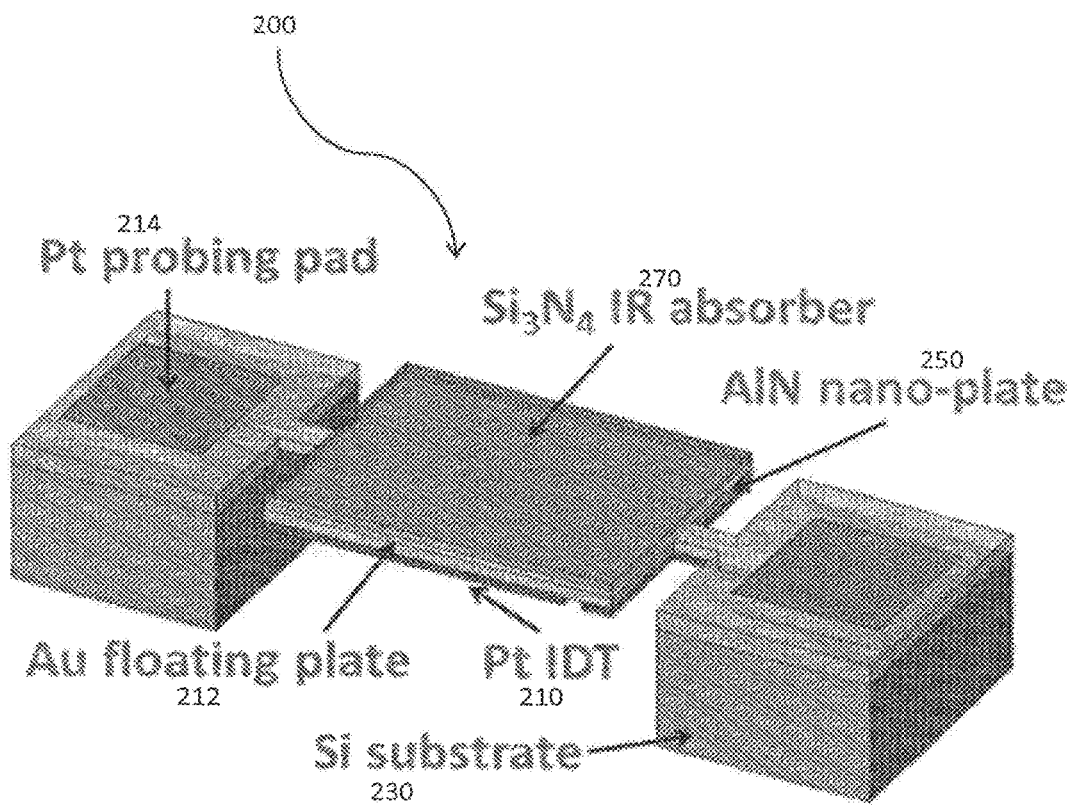
FIG. 7 depicts a schematic representation of a NEMS resonant infrared detector, according to one embodiment.

A schematic representation of the AlN NPR NEMS IR detector is shown in FIG. 7. The IR detector includes an AlN nano-plate resonator 200 working at a higher order contour-extensional mode of vibrations via piezoelectric transduction. An interdigital electrode 210 on the bottom of the AlN layer may excite the high frequency bulk acoustic mode of vibration into the nano-plate 250 while an electrically floating thin metal plate 212 (100 nm thick gold) on top of the AlN nano-plate may confine the electric field within the AlN layer and improve the electromechanical coupling. Probing pads 214 may be electrically connected to the interdigital electrode 210 for the purposes of connecting the resonator to electrical circuits. A thin $Si_3N_4$ layer 270 (100 nm thick) may be integrated on top of the gold electrically floating electrode as an effective LWIR absorber. The thickness of such $Si_3N_4$ layer 270 directly affects both the IR absorptivity (the thicker is the $Si_3N_4$ layer, the higher is the absorption) and the quality factor, Q, (the thinner is the $Si_3N_4$ layer, the lower the mechanical loading effect on the resonator and the higher the Q) of the device. A tradeoff between absorptivity and quality factor may be considered to optimize the thickness of the integrated $Si_3N_4$ absorber. The thickness of the $Si_3N_4$ absorber was set to 100 nm in order to avoid significant mechanical loading and Q degradation of the ultra-thin (250 nm thick) NPR. The thickness of the $Si_3N_4$ layer produces absorptivity as high as 15% in the LWIR range.

The resonance frequency of the AlN NPR IR detector can be expressed as $$f = \frac{1}{2W_0} \sqrt{\frac{E_{eq}}{\rho_{eq}}},$$

where, $W_0$ is the pitch of the interdigital bottom electrode, and $E_{eq}$ and $\rho_{eq}$ are respectively the equivalent Young's modulus and density of the material stack forming the resonator. Because of the highly temperature-dependent equivalent Young's modulus, the resonance frequency of the device is highly sensitive to temperature, with typical values of the temperature coefficient of frequency, TCF, on the order of about −30 to about −40 ppm/K, with values of down to about −100 ppm/K. According to one embodiment, the TCF may be less than about −30 ppm/K, or less. According to one embodiment, the desirable thermal isolation (ultra-high thermal resistance) and low thermal mass of the nano-plate resonator (i.e. ~500 nm thick freestanding membrane) result in the absorbed IR radiation producing a large and fast increase of the device temperature. According to one embodiment, the temperature increase translates to a large and fast variation of the device mechanical resonance frequency due to the high TCF of the device. The high quality factor, Q, of the resonant system, which is not exhibited by pre-existing microbolometers, allows the detection of small IR-radiation-induced frequency variations, resulting in a fast and high-resolution IR detector. For this kind of resonant IR detector described herein, a lower limit of detection and faster response may be achieved by scaling the volume of the NEMS resonator to reduce the thermal mass and increase the thermal resistance while maintaining high Q values, to maintain low noise performance. The desirable scaling capabilities and transduction properties at nanoscale of AlN ultra-thin-films allow the thickness of the AlN nano-plate resonator to be about 250 nm, which is thinner than the previously demonstrated MEMS resonant IR detectors implemented with gallium nitride (2.15 μm) and quartz (6.9 μm). Other thickness values are also possible in the resonators provided herein, as described above.

The NPR radiation detector may be fabricated by any suitable fabrication process. According to one embodiment, the radiation detector may be fabricated by a five-mask post-CMOS compatible microfabrication process. The fabrication process may include: disposing a first electrode over a substrate, disposing a piezoelectric layer over the substrate and first electrode, disposing a second electrode over the piezoelectric layer, disposing an absorber layer over the piezoelectric layer, etching the piezoelectric layer to form a piezoelectric nano-plate and releasing the nano-plate from the substrate. The substrate may be any suitable material, such as silicon. According to one embodiment the substrate may be a silicon wafer. According to one embodiment, the disposing of the piezoelectric layer may include any suitable process, such as a sputter deposition process. The piezoelectric layer may include any suitable material, such as the aforedescribed piezoelectric materials. According to one embodiment, the disposing of the first electrode may include any appropriate process, such as a sputter deposition process. The first electrode may be an interdigital electrode. According to one embodiment, the disposing of the second electrode may include any appropriate process, such as a sputter deposition process. According to one embodiment, the disposing of the absorber layer may include any appropriate process, such as a chemical vapor deposition (CVD) process. According to one embodiment, the etching of the piezoelectric layer to form a piezoelectric nano-plate may include any suitable process, such as an ion conductive plasma (ICP) process. The forming of the nano-plate may include forming a perimeter of the nano-plate. According to one embodiment, the releasing the piezoelectric layer from the substrate may include any suitable process, such as an isotropic etching process.

Figure 8:
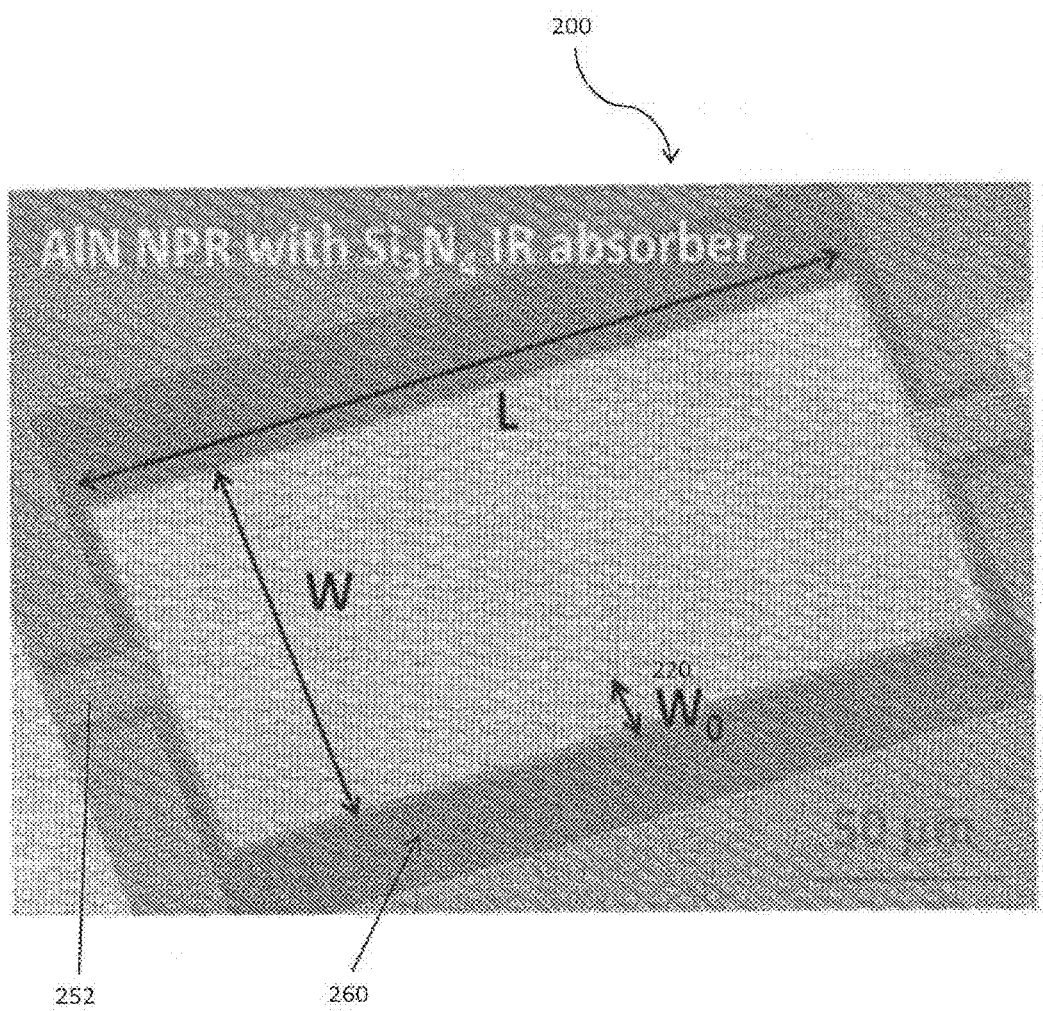
FIG. 8 depicts an SEM image of a NEMS resonant infrared detector, according to one embodiment.

An exemplary AlN NPR IR detector was fabricated by a five-mask post-CMOS compatible microfabrication process. A high resistivity Silicon (Si) wafer (>10000 Ω·cm) was used as a substrate. A 50 nm thick Platinum (Pt) film was sputter-deposited and patterned by lift-off on top of the Si substrate to define a bottom interdigital electrode. Then, a 250 nm AlN film was sputter-deposited, and vias to access the bottom IDT electrode were etched by $H_3PO_4$. Next, a 100 nm thick Au film was deposited and patterned by lift-off as a top floating metal plate to confine the electrical field. Then, a 100 nm thick $Si_3N_4$ film was deposited by plasma enhanced chemical vapor deposition (PECVD) and patterned on top of the Au plate as an IR absorber. The AlN film was etched by Inductively Coupled Plasma (ICP) etching in $Cl_2$ based chemistry to define the perimeter of the resonant nano-plate. Finally, the structure was released from the substrate by $XeF_2$ isotropic etching of the silicon substrate. An SEM image of a fabricated AlN NPR IR detector 200 is shown in FIG. 8, including supports 252 and gaps 260 that allow the movement of the resonator nano-plate. The device shown in FIG. 8 has a length, L, of 200 μm, a width, W, of 100 μm and a pitch, $W_0$, of 11 μm, producing a resonance frequency of 196.6 MHz.

Figure 9:
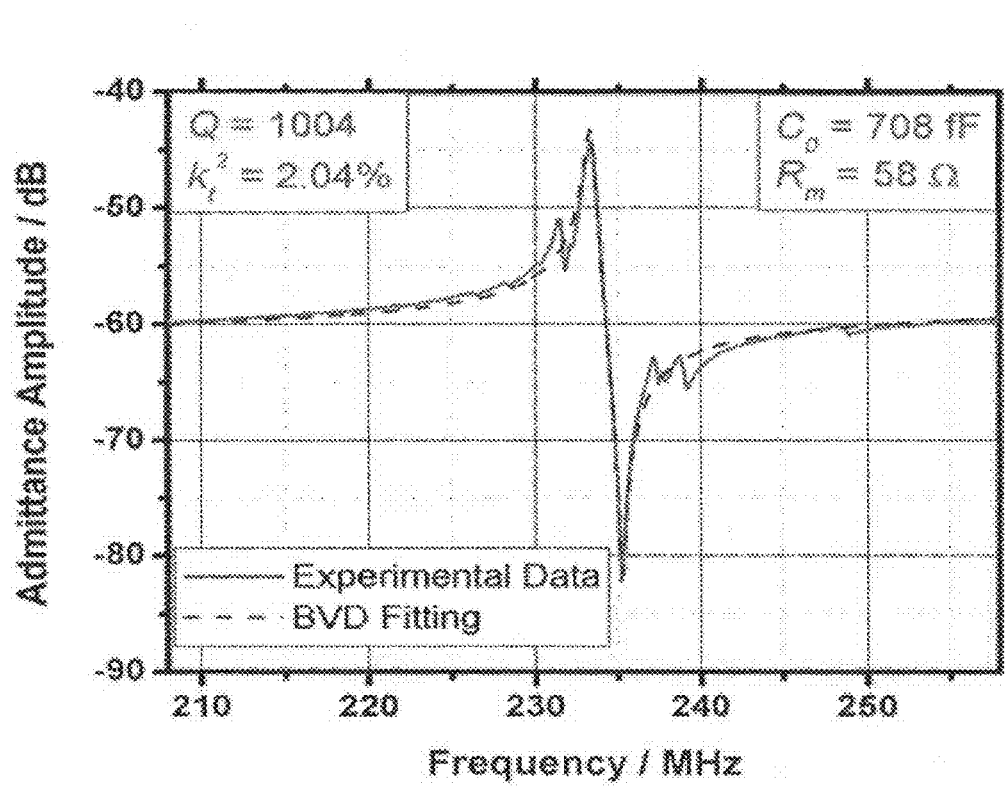
FIG. 9 depicts the admittance amplitude of an AlN resonator without an absorber layer as a function of frequency, according to one embodiment.
Figure 10:
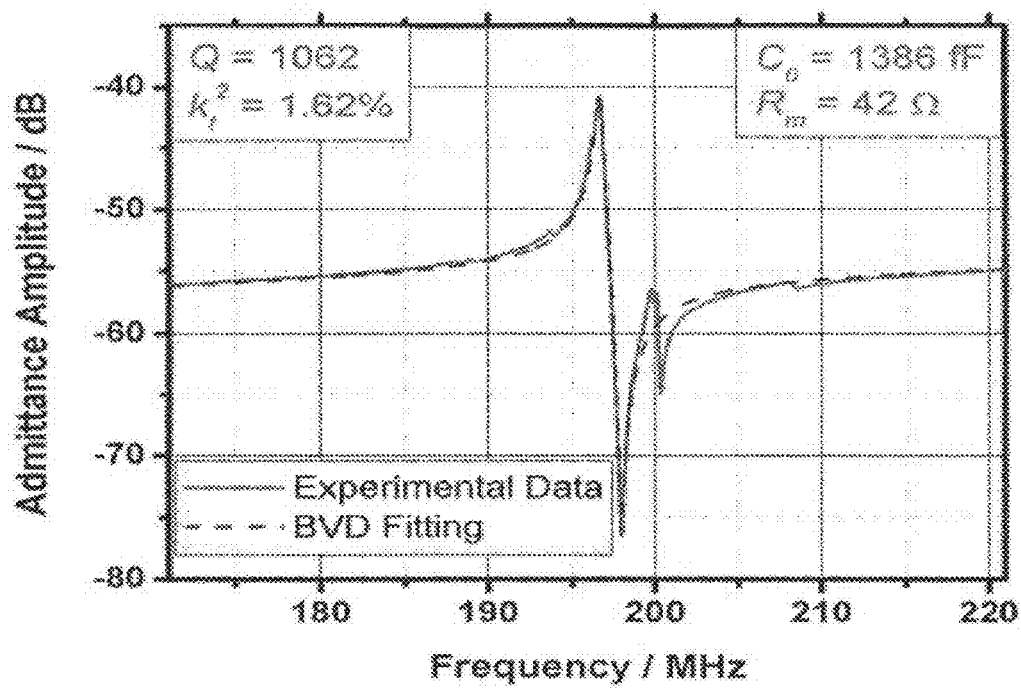
FIG. 10 depicts the admittance amplitude of a NEMS resonant infrared detector as a function of frequency, according to one embodiment.

To calibrate the IR detector, a reference device based on the same core design of the AlN NPR IR detector but without a $Si_3N_4$ thin film absorber was fabricated on the same wafer. The electrical response of the fabricated reference device and IR detector were measured by an Agilent E5071C network analyzer after performing a short-open-load calibration on a reference substrate. The measured admittance and Butterworth-Van Dyke (BVD) fitting curves versus frequency of the reference device and the AlN NPR IR detector are shown in FIGS. 9 and 10. respectively. The resonance frequency of the reference device and the IR detector were measured to be 233.3 MHz and 196.6 MHz, respectively. The relatively lower resonance frequency of the IR detector is a result of the loading effect of the $Si_3N_4$ film on top of the AlN NPR. However, despite the integration of the $Si_3N_4$ absorber, a high device Figure of Merit (17.2) was achieved compared with the reference device (20.5). Despite the reduced volume of the fabricated AlN NPR IR detector, a high quality factor (Q~1062) was achieved comparable to quality factors previously demonstrated by ~10λ larger volume gallium nitride MEMS IR detectors (Q~1200) and ~200× larger volume quartz MEMS IR detectors (Q~4200), demonstrating the desirable scaling advantages of the AlN NPR IR detector provided herein.

Figure 11:
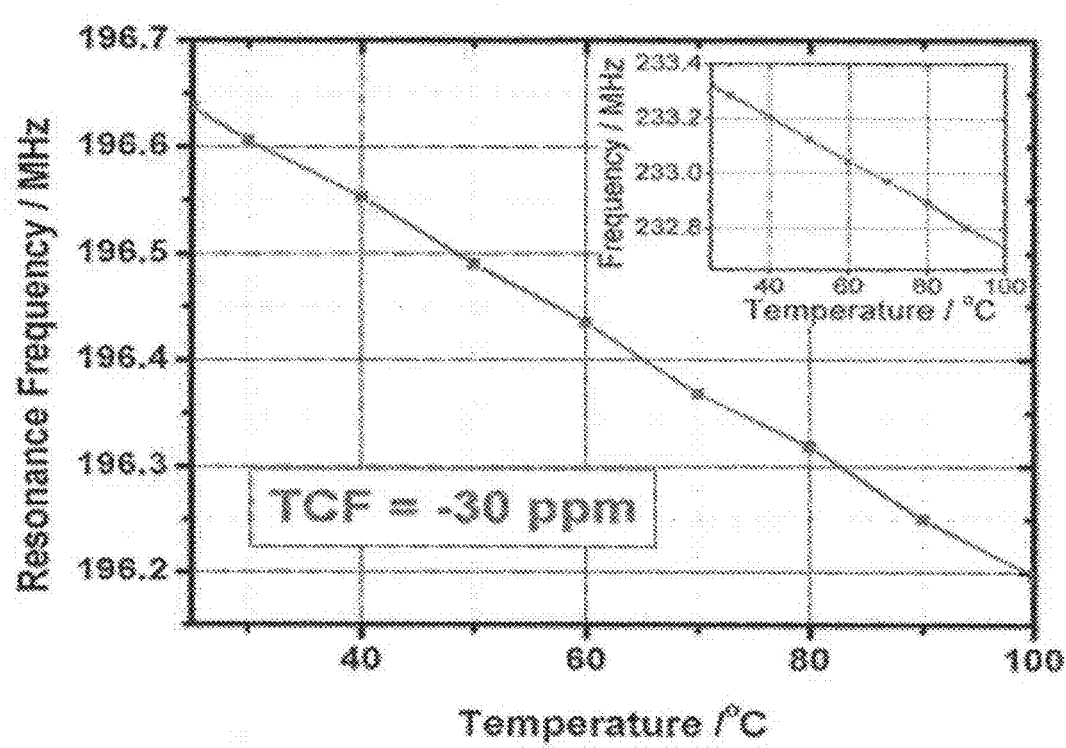
FIG. 11 depicts the resonance frequency of a NEMS resonant infrared detector as a function of temperature, according to one embodiment.
Figure 12:
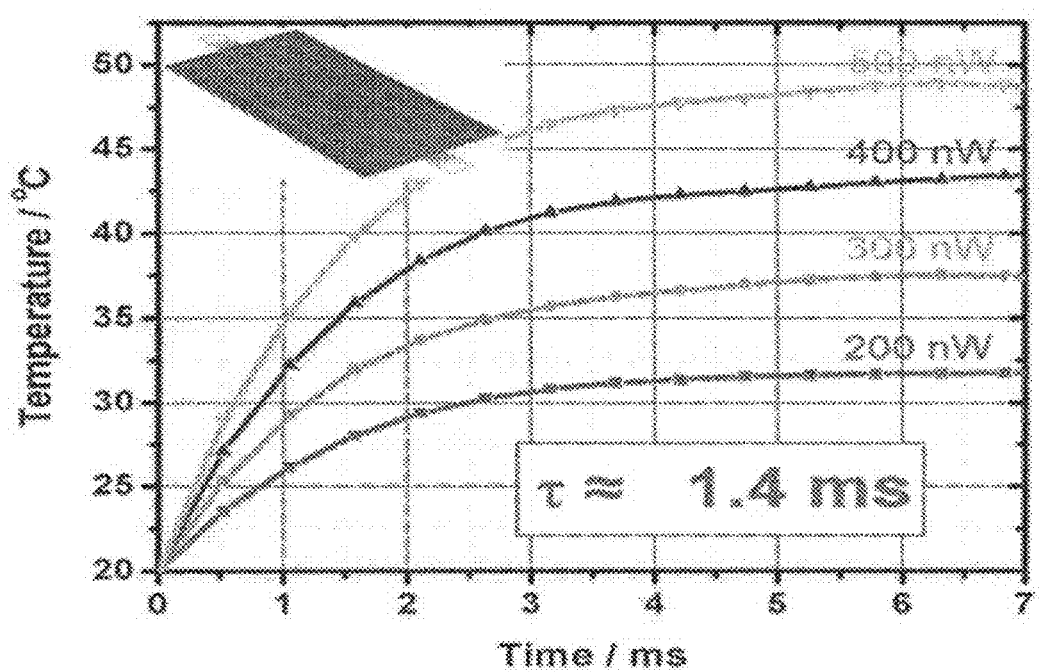
FIG. 12 depicts the temperature of a NEMS resonant infrared detector as a function of time upon exposure to radiation, according to one embodiment.
Figure 13:
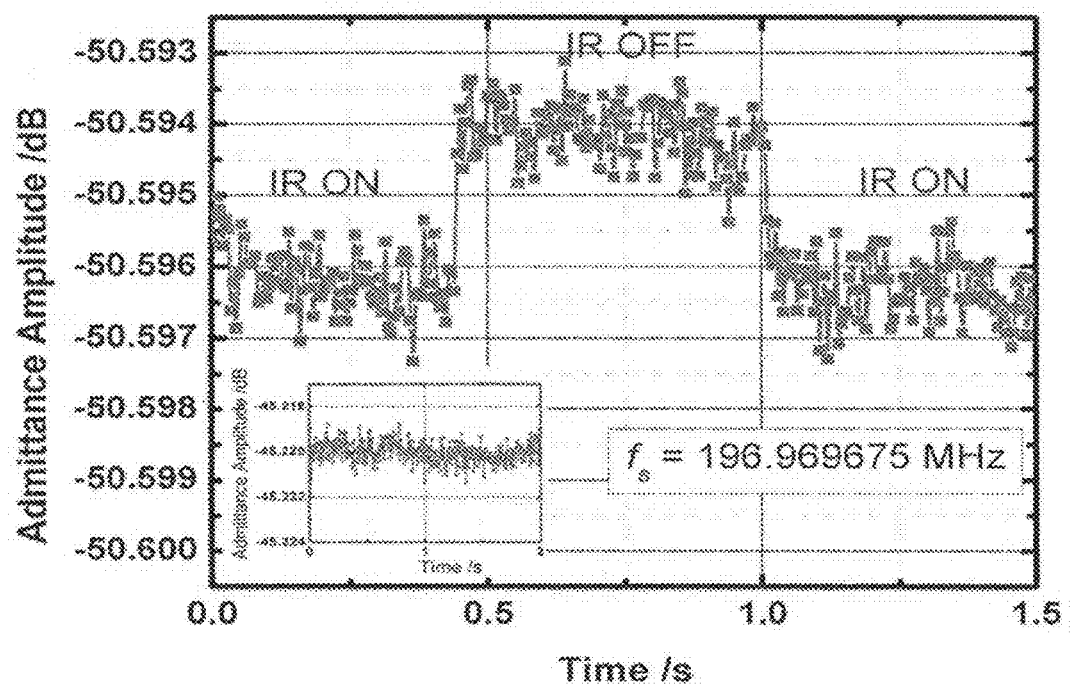
FIG. 13 depicts the admittance amplitude of a NEMS resonant infrared detector as a function of time upon exposure to infrared radiation, according to one embodiment.

The IR response of the fabricated NEMS IR detector was tested by measuring the admittance amplitude change of the device when exposed to IR radiation generated by a Cool Red light source from Ocean Optics with a wavelength of 0.9-25 μm coupled to an optical fiber with a transmission range of 300 nm-4.5 μm. The transient response of the device was measured by exciting the resonator at a single frequency, $f_c$, and monitoring the variation over time of the device admittance amplitude. The excitation frequency, $f_c$=196.97 MHz, was set between the series and parallel resonances, where the slope of admittance amplitude curve versus frequency is at a maximum (0.0263 dB/kHz). The responsivity of the IR detector was calculated by multiplying the slope of the admittance amplitude versus frequency (0.0263 dB/kHz) by the TCF (−30 ppm/K) and the thermal resistance (56 mK/~W), producing a responsivity of ~8837 dB/W. The TCF of the NEMS IR detector was determined to be about −30 ppm/k based on the measurement of the resonance frequency as a function of temperature, as shown in FIG. 11. The inset of FIG. 11 shows the resonant frequency of the reference device as a function of temperature, producing a TCF of the reference device of about −34 ppm/K. The thermal time constant of the NEMS IR detector was determined on the basis of temperature response of the detector as a function of time under exposure to IR radiation to be about 1.4 ms, as shown in FIG. 12. The inset of FIG. 12 depicts the uniform temperature distribution across the resonant detector. The measured response of the IR detector is shown in FIG. 13, with the inset showing that no response was recorded for the reference device exposed to IR radiation under the same conditions. An admittance amplitude variation of 0.002 dB was recorded and, given the sensor responsivity of ~8837 dB/W, the amount of IR power absorbed by the device was extracted to be ~226 nW. The root mean square (RMS) noise of the measured admittance amplitude in 1 Hz bandwidth was extracted to be 21.4 μdB/$Hz^{1/2}$. The noise equivalent power (NEP) of the IR detector was estimated by dividing the measured noise spectral density (RMS noise in 1 Hz bandwidth measurement) by the responsivity, and was found to be 2.4 nW/$Hz^{1/2}$.

Figure 14:
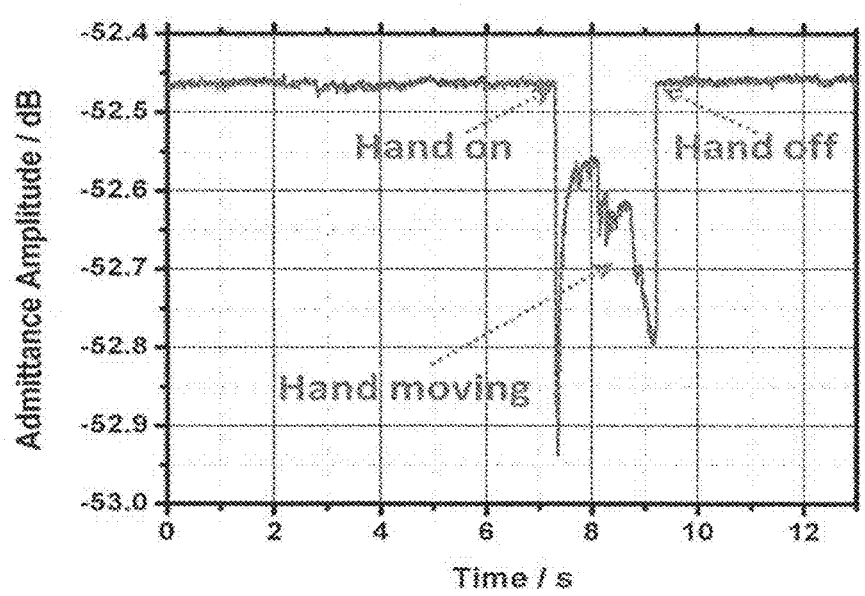
FIG. 14 depicts the admittance amplitude of a NEMS resonant infrared detector as a function of time upon exposure to infrared radiation emitted by a human hand, according to one embodiment.

Since the radiation peak of the human body is around ~10 μm, the use of $Si_3N_4$ thin film absorber (wavelength absorption range of 8-14 μm) may allow the device to be capable of human body tracking applications. To investigate the capability of the NEMS IR detector to detect human body radiation, a human hand was placed in the field of view of the device and its response was monitored over time, as shown in FIG. 14. A maximum admittance amplitude change of 0.48 dB was recorded when a human hand was in the field of view of the IR detector (~1 cm away from the device), which corresponds to a device temperature rise of ~3 K, and ~54 μW of IR power absorbed by the detector (given the thermal resistance of 56 mK/μW estimated by FEM simulation). The perturbation of the device response is due to small movements of the imaged human hand, indicating the high sensitivity and the fast response time of the device.

Despite the overall reduced volume and the integration of the $Si_3N_4$ absorber, the device showed high electromechanical performance (quality factor Q=1062 and electromechanical coupling coefficient $k_t^2$=1.62%). By taking advantage of the aforedescribed desirable scaling and transduction properties of AlN at nanoscale, a high resolution (measured NEP~2.4 nW/$Hz^{1/2}$) and fast (thermal time constant~1.4 ms) IR detector prototype was experimentally demonstrated indicating the great potential of this technology for the implementation of ultra-fast and sensitive thermal imaging systems.

Figure 15:
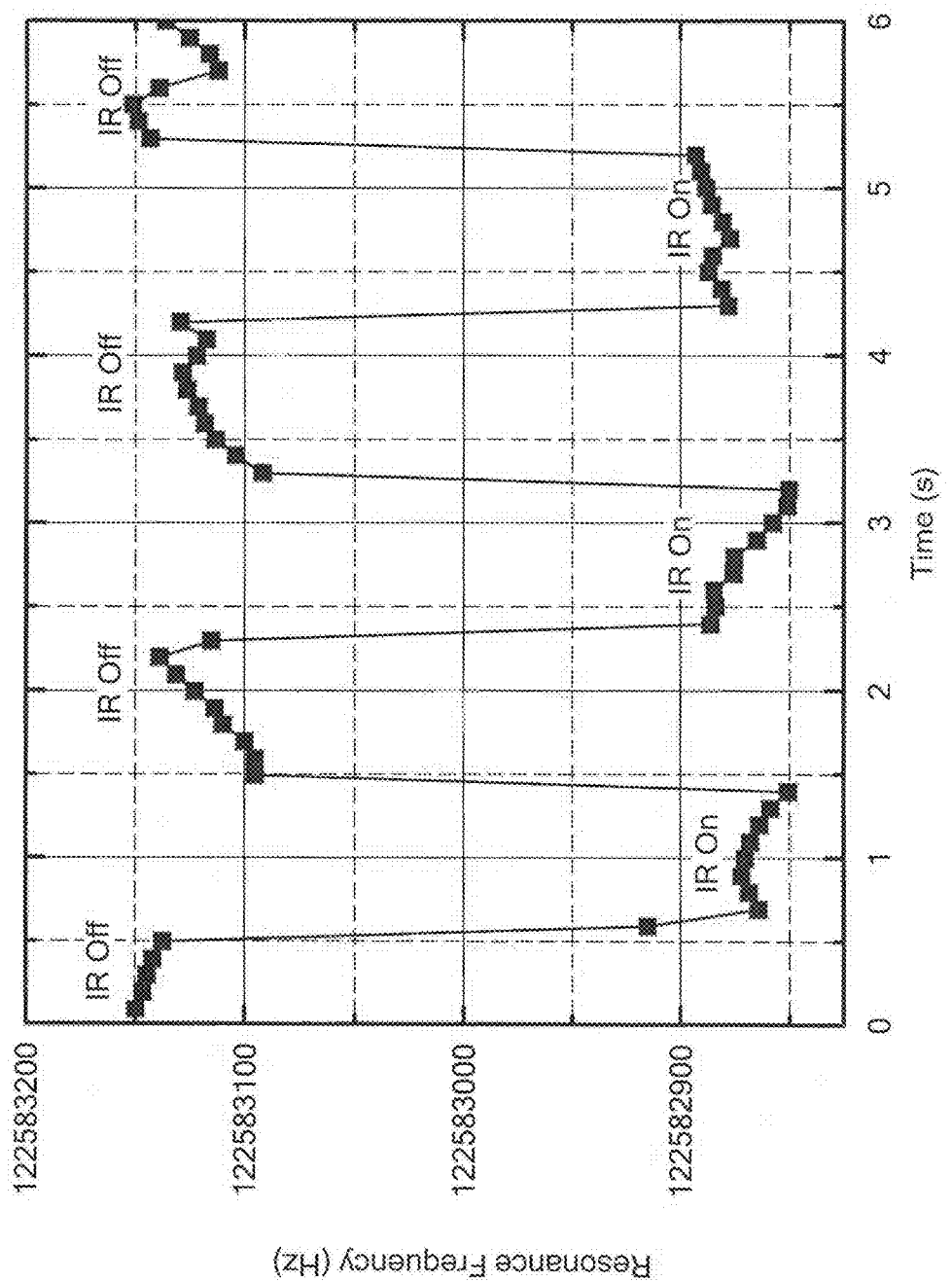
FIG. 15 depicts the resonance frequency of a NEMS resonant infrared detector as a function of time upon exposure to broadband infrared radiation, according to one embodiment.

The IR response of the system was tested with a frequency counter and a broadband IR source with a wavelength range of 900 nm to 25 μm. The measured IR response of the system is shown in FIG. 15. The IR source was placed 10 cm away from the IR detector chip and the gate time of the frequency counter was set to be 100 ms. A thermal time constant of 1.3 ms and a measured responsivity of 267 Hz/μW were achieved. The extracted noise equivalent power (NEP) of the device was 18 nW/$Hz^{1/2}$.

Figure 16A:
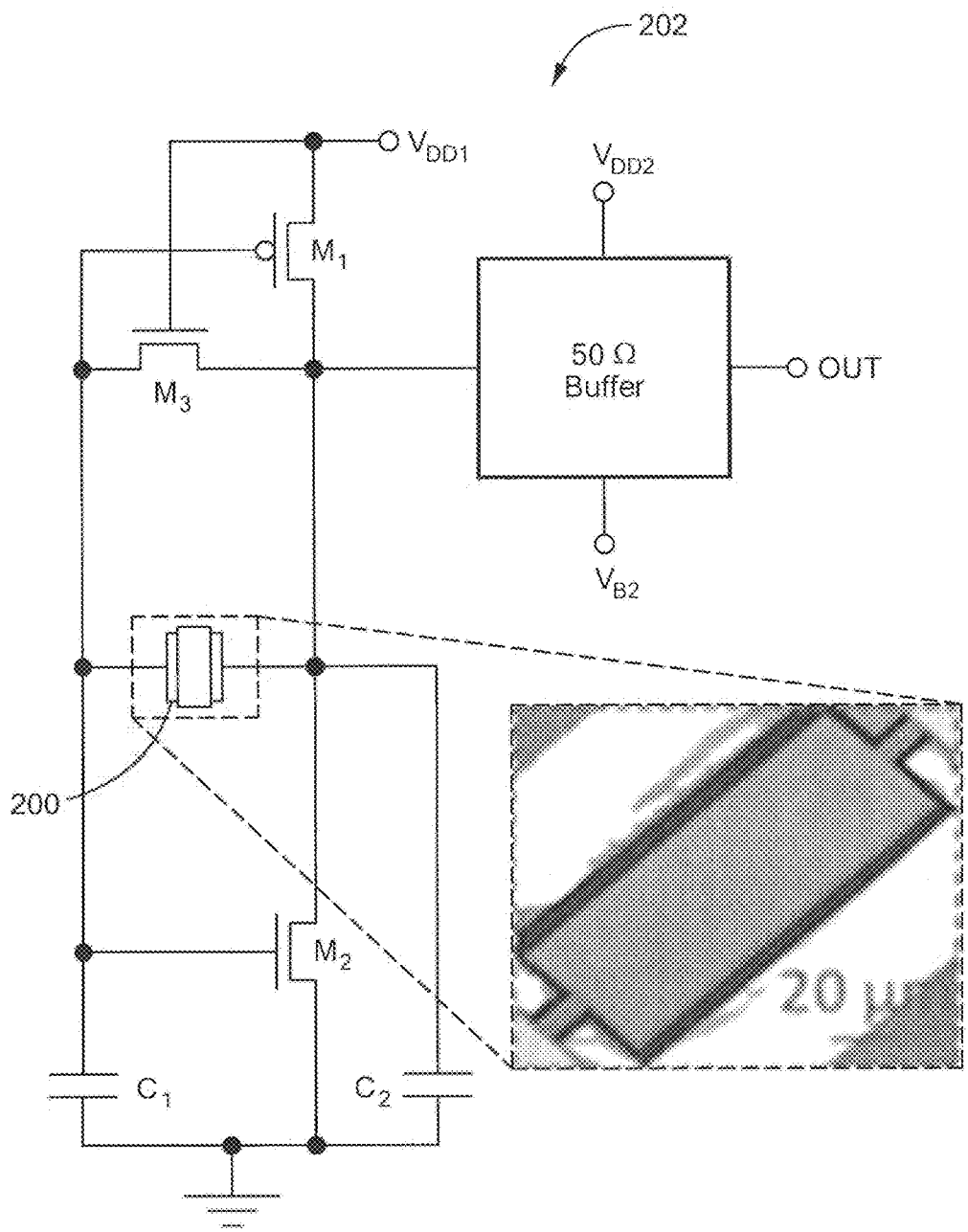
FIGS. 16(a)-16(c), respectively, depict a NEMS resonant infrared sensor connected to a self-sustained CMOS oscillator circuit for direct frequency readout, Allan Deviation of a NEMS resonant infrared sensor output signal as a function of time, and NEMS resonant infrared sensor resonance frequency as a time with an inset depicting NEMS resonant infrared sensors bonded to a CMOS readout chip, according to one embodiment.
Figure 16B:
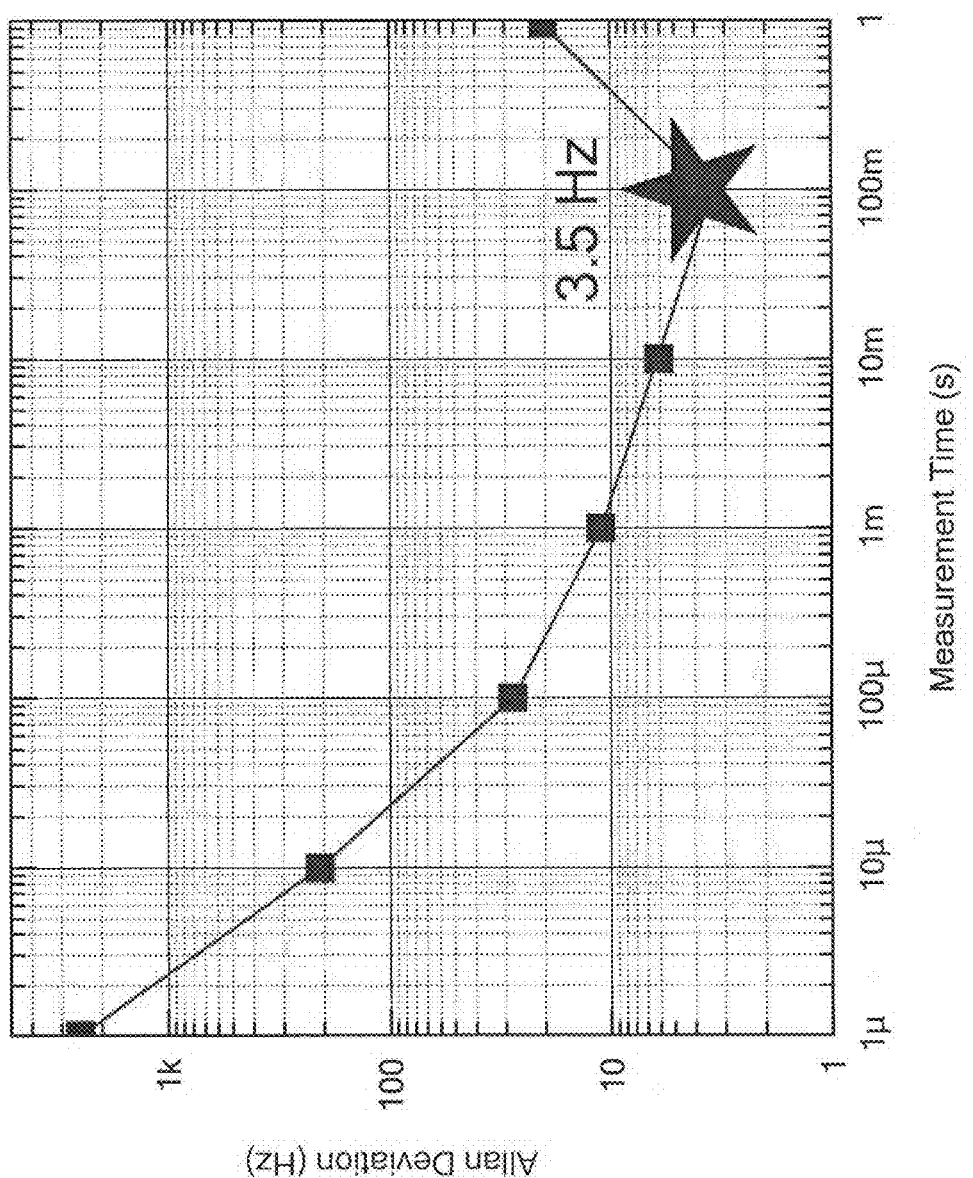
Figure 16C:
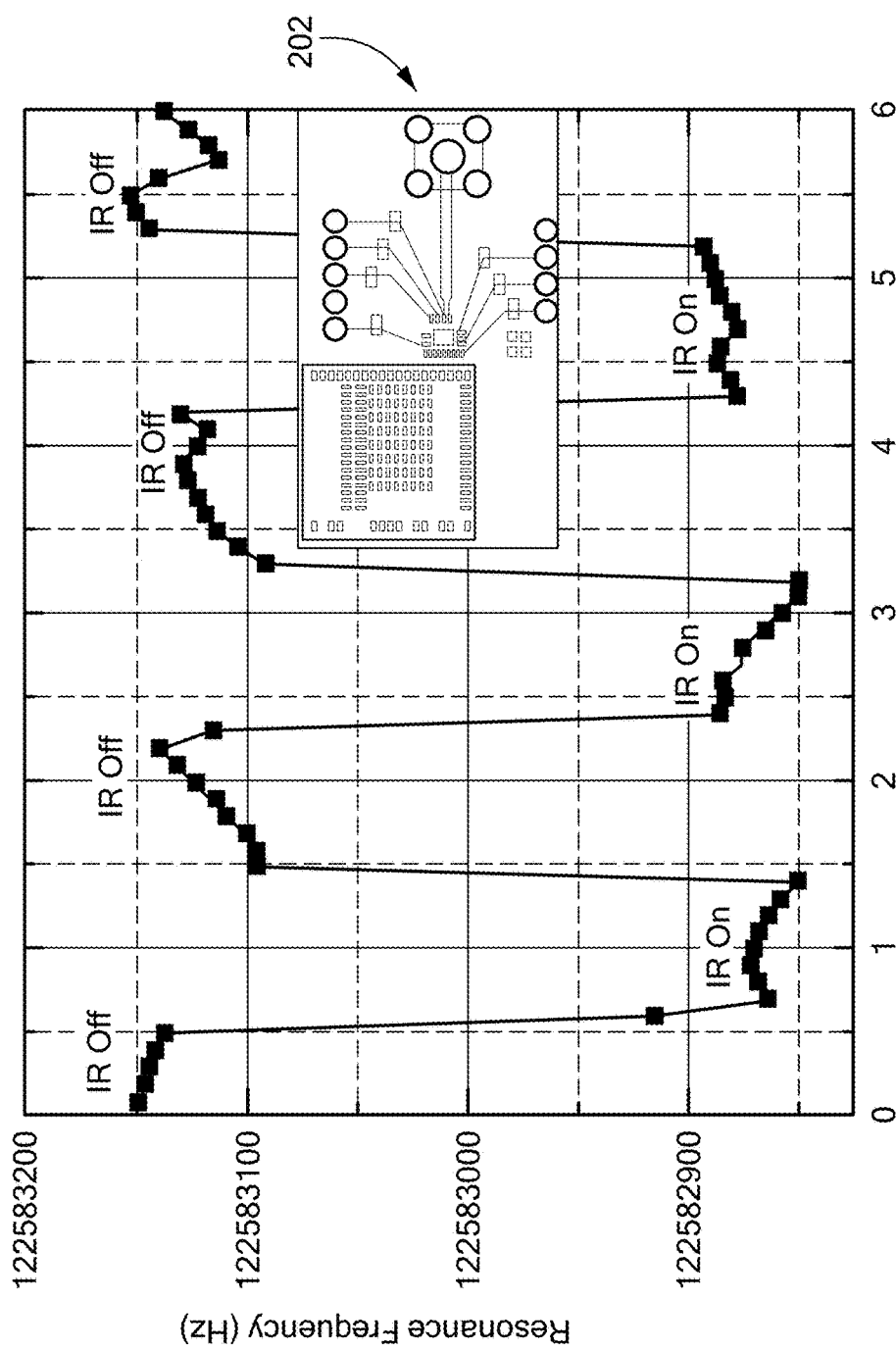

Compact and low-power CMOS circuits may be integrated with the radiation detector as direct frequency readouts, due to the high electromechanical performance of the resonant structure, as shown in FIG. 16(*a*). According to one embodiment, the CMOS circuits may be configured to provide an electronic readout of the frequency of the nano-plate. According to another embodiment, any appropriate electronic circuit may be integrated with the radiation detector to provide an electronic readout of the frequency of the nano-plate. An AlN NPR chip bonded to a CMOS readout chip fabricated in an AMIS 0.5 μm CMOS process is shown in the inset of FIG. 16(*c*). FIG. 16(*b*) depicts the measured Allan Deviation of the fabricated sensor output signal, showing an ultra-low noise induced frequency fluctuation of only about 3.5 Hz at a resonant frequency of 122.6 MHz, or 28 ppb.

The most diffused pre-existing technique used to perform IR/THz spectroscopy Fourier Transform Infrared (FTIR) suffers from fundamental limitations that may prevent the implementation of compact, lightweight and portable field-based analytical tools for rapid and reliable identification of unknown hazardous gases and vapors for homeland security, defense, intelligence and healthcare applications. The challenge in bringing FTIR spectroscopy out of the laboratory and into the field may be attributed to that the maximum attainable spectral resolution (in cm units) of a FTIR system is inversely related to the maximum retardation (in length units) produced by the interferometer. As a result, high-resolution FTIR spectrometers may need high retardation and, thus, a large amount of travel in the moving mirror of the interferometer. For example, resolving spectral features with 100 MHz resolution would need a mirror travel of 3 m. This limitation renders FTIR inadequate for the implementation of miniaturized and high-resolution field-based spectrometers.

A desirable frequency-domain IR spectroscopy system may pass broad band IR radiation directly through the sample of interest and focus the radiation onto a multi-color IR/THz detector array capable of direct measurement of the frequency-dependent transmission through the sample of interest. Such a frequency-domain technique may have several advantages compared to FTIR, including but not limited to: it does not need mechanical moving mirrors and produces higher spectral resolution by eliminating limits associated with the travel of the moving mirror, it offers the possibility to selectivity scan specific frequency regions of interest with adjustable resolution, and it produces a faster acquisition time since transmission data at different frequencies is simultaneously acquired and no sampling is required. Despite the extraordinary potential of ideal frequency-domain IR/THz spectroscopy systems, the actual implementation of compact, low cost and high performance frequency domain IR spectrometers has previously been prevented by the fundamental lack of high resolution, fast, highly miniaturized, uncooled and multi-color IR detector technology capable of detecting low power levels.

Figures 17A, 17B, 17C:
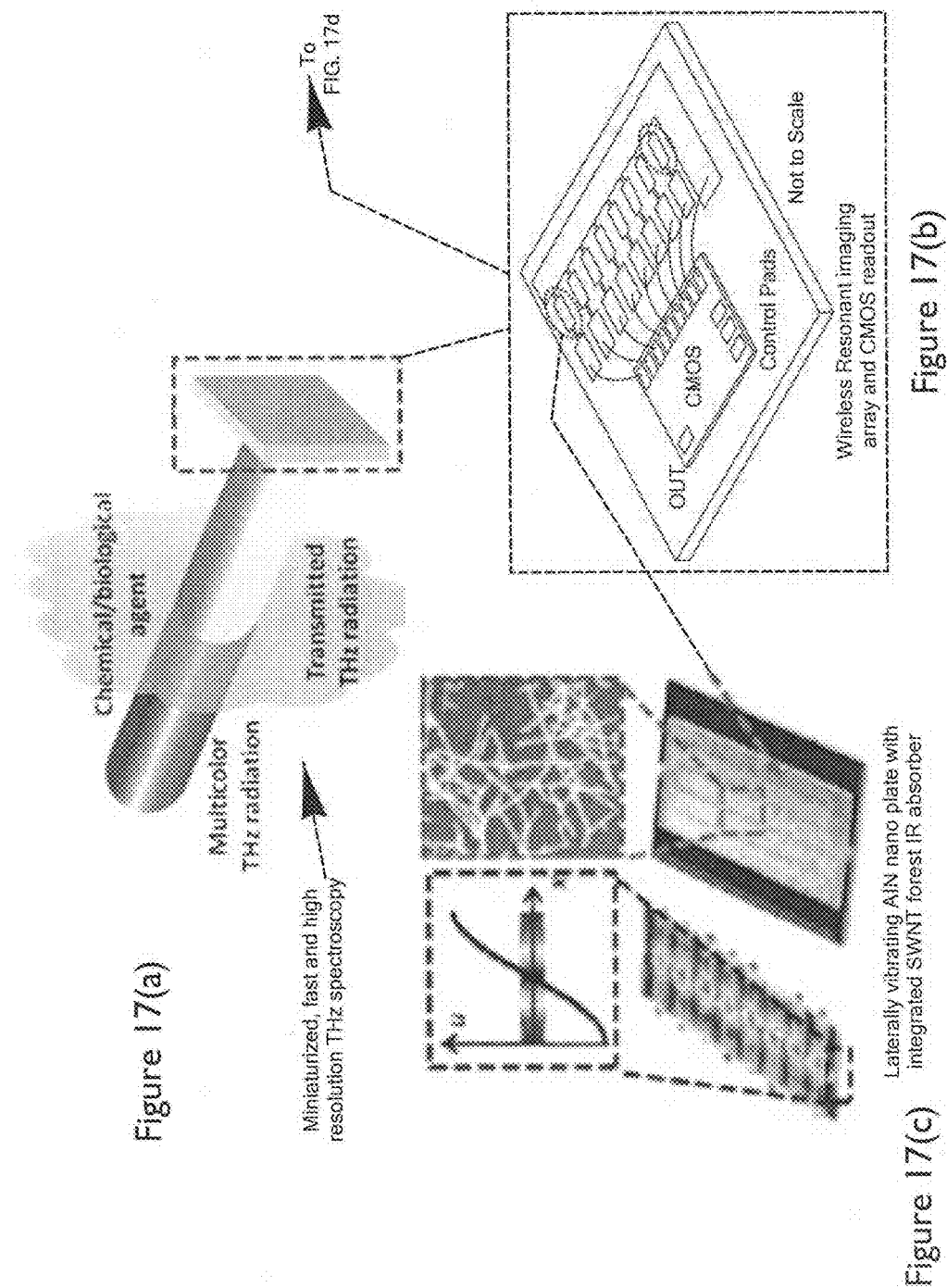
FIGS. 17(a)-17(e), respectively, depict a schematic representation of THz spectroscopy, an integrated wireless resonant imaging array and integrated CMOS readout, an infrared detector including an AlN resonator a single wall nanotube forest absorber layer, an AlN resonator, and a THz detector including an MN resonator integrated with an efficient metamaterial absorber layer, according to one embodiment.
Figure 17D:
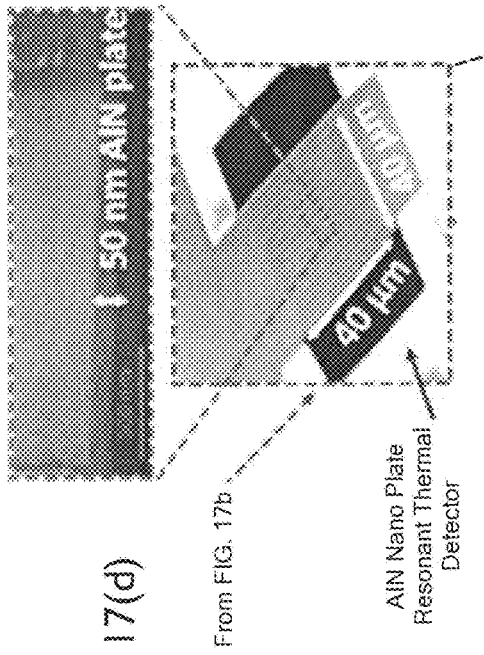
Figure 17E:
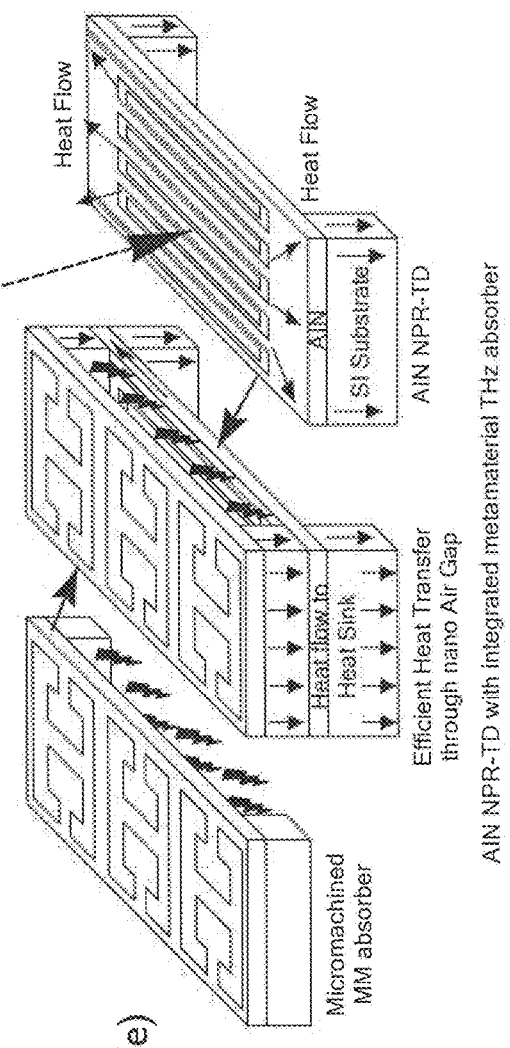

The ultra-high resolution, fast and multi-color IR NEMS/MEMS resonant detectors operating at room temperature and without active cooling disclosed herein may enable the implementation of a new generation of miniaturized and efficient frequency-domain IR spectroscopy systems. A schematic representation of how such a spectroscopy system would operate according to one embodiment is depicted in FIG. 17(*a*). These systems have applications including defense and intelligence applications such as chemical and biological threat detection, night vision, infrared homing, multi-color infrared seeking, remote sensing, distributed environmental monitoring and healthcare applications such as pathogen and drug detection and identification.

As shown in FIG. 17(*c*), the IR/THz detector includes two components: the core element is an AlN nano-plate (10s of nm thick) resonator 250 efficiently excited in a contour-mode of vibration by piezoelectric transduction as shown in FIG. 17(*d*), and the other is an integrated absorber on top of the AlN NPR, which may include any IR/THz radiation absorbing materials/structures. As shown in FIG. 17(*b*), compact and low-power CMOS circuits may be directly integrated with the radiation detector as direct frequency readouts 202, due to the high electromechanical performance of the resonant structure. The resonator 200 integrated with the absorber layer is depicted in FIG. 17(*e*).

According to one embodiment, an infrared detector based on a nano-plate resonator and an integrated absorber may be fabricated. The absorber may be an $Si_3N_4$ absorber. An exemplary fabrication process is shown in FIG. 18(*a*), a Pt bottom electrode 210 was formed on a high resistance silicon substrate 230 by a sputter deposition and lift-off process. An AlN layer was then disposed over the silicon substrate 230 and the bottom electrode 210 by a sputter deposition process, as shown in FIG. 18(*b*). The AlN layer was wet etched with $H_3PO_4$ to expose a portion of the bottom electrode. As shown in FIG. 18(*c*), a layer of $Si_3N_4$ 270 was deposited by a plasma enhanced chemical vapor deposition process (PECVD) followed by patterning by an ICP process. Probing pads 214 including Pt or Au were formed by a sputter deposition and lift-off process. The AlN was then dry etched in $Cl_2$ based chemistry to form gaps that defined the perimeter of the nano-plate, as shown in FIG. 18(*d*). The nano-plate was then released from the silicon substrate and a release void 265 was formed via an $XeF_2$ dry release process.

According to another embodiment, an infrared/terahertz detector based on a nano-plate resonator and an integrated metamaterial absorber may be fabricated. The absorber may be a Pt metamaterial. The detector may include an air gap between the nano-plate resonator and the absorber. According to one embodiment, the air gap may be formed by a separation between the nano-plate resonator and the absorber of at least about 1 nm. According to another embodiment, the air gap may be formed by a separation between the nano-plate resonator and the absorber of less than about 1 mm. A process for fabricating a detector including an air gap may additionally include the steps of: disposing a sacrificial layer over the piezoelectric layer, disposing the absorber layer over the sacrificial layer and removing the sacrificial layer to form an air gap between the absorber and the piezoelectric layer. The sacrificial layer may be any suitable material, such as polysilicon. The disposing of the sacrificial layer may include any suitable process. The removing of the sacrificial layer may include any suitable process, such as the process employed to release the nano-plate from the substrate. An exemplary fabrication process included forming a Pt bottom electrode 212, AlN layer 230 and Al top electrode 210 on a silicon substrate 250 by a sputter deposition and lift off process, as shown in FIG. 19(*a*). The AlN was then dry etched in $Cl_2$ based chemistry to form gaps that defined the perimeter of the nano-plate, as shown in FIG. 19(*b*). A polysilicon sacrificial layer 280 was then deposited and patterned over the structure, followed by deposition and patterning of a silica nano-plate 282 and deposition and patterning of a Pt metamaterial, as shown in FIG. 19(*c*). A dry release $XeF_2$ process was employed to release the nano-plate resonator from the substrate, form a release void 265 and to remove the sacrificial polysilicon layer to form an air gap 290 between the absorber and the resonator, as shown in FIG. 19(*d*).

Resonator Including 2D Electrically Conductive Material

Micro- and Nano-electromechanical systems (MEMS/NEMS) resonators may be valuable for multiple sensing applications at least as a result of the combination of high sensitivity to external perturbations due to their very reduced dimensions, and ultra-low noise performance due to the intrinsically high quality factor, Q, of such resonant systems. Among different MEMS/NEMS resonant sensors, the AlN nano plate resonant sensor (NPR-S) technology, which involves exciting high frequency (about 100 MHz to about 10 GHz) bulk acoustic waves in piezoelectric nano-plates (thickness <1 μm) comprising AlN may be a desirable solution for the realization of sensitive, miniaturized and low power chemical sensors, thermal detectors, and magnetic field sensors. The reduced mass and high frequency of operation of the nanomechanical resonant elements combined with their high Q values and power handling capabilities make the AlN NPR-S capable of achieving unprecedented values of limit of detection and detection speed.

The performance of MN NPR-S in terms of sensitivity, limit of detection and detection speed may be further improved by scaling thickness and increasing the operating frequency of the AlN resonant nano plate while maintaining, at the same time, high values of Q and transduction efficiency. Such device scaling has previously been limited by the physical and electrical properties of the metal electrode employed to provide the excitation electrical signal to the piezoelectric nano resonator. Ultra-thin metal electrodes, when scaled proportionally to the AlN plate, may introduce high values of electrical resistance that electrically load the Q of the resonant element and limit the resolution of the sensor. Thicker metal electrodes that are not scaled proportionally to the AlN plate may mechanically load the device by acting as a heavy mass on top of the nanoscale piezoelectric resonant plate, thereby negatively affecting both its Q and transduction efficiency.

A 2D graphene electrode may be located on top of an AlN resonant nano plate. Graphene is a single-atomic-layer, 2D system composed solely of carbon atoms arranged in a hexagonal honeycomb lattice. This atomically thick sheet of carbon is an excellent electrical conductor, with exceptionally high mobility for both electrons and holes of about $10^5$ $cm^2\ V^{-1}\ s^{-1}$. The ultra-low mass 2D graphene layer may be employed, in lieu of a relatively thicker and heavier metal film, as a top electrically floating electrode in a lateral field excitation scheme used to excite vibration in the piezoelectric nano plate. In at least one instance, the 2D graphene top layer is the thinnest and lightest conductive electrode ever used to excite vibration in a piezoelectric NEMS resonator and has the potential to be used as an effective chemically interactive material with the largest possible surface to volume ratio. According to one embodiment, any suitable 2D electrically conductive material may be employed as the electrode. According to one embodiment, the electrode may be selected from at least one of graphene and molybdenum disulfide. The electrode here may refer to the top electrode, the bottom electrode, or both, depending on the application.

Figure 20:
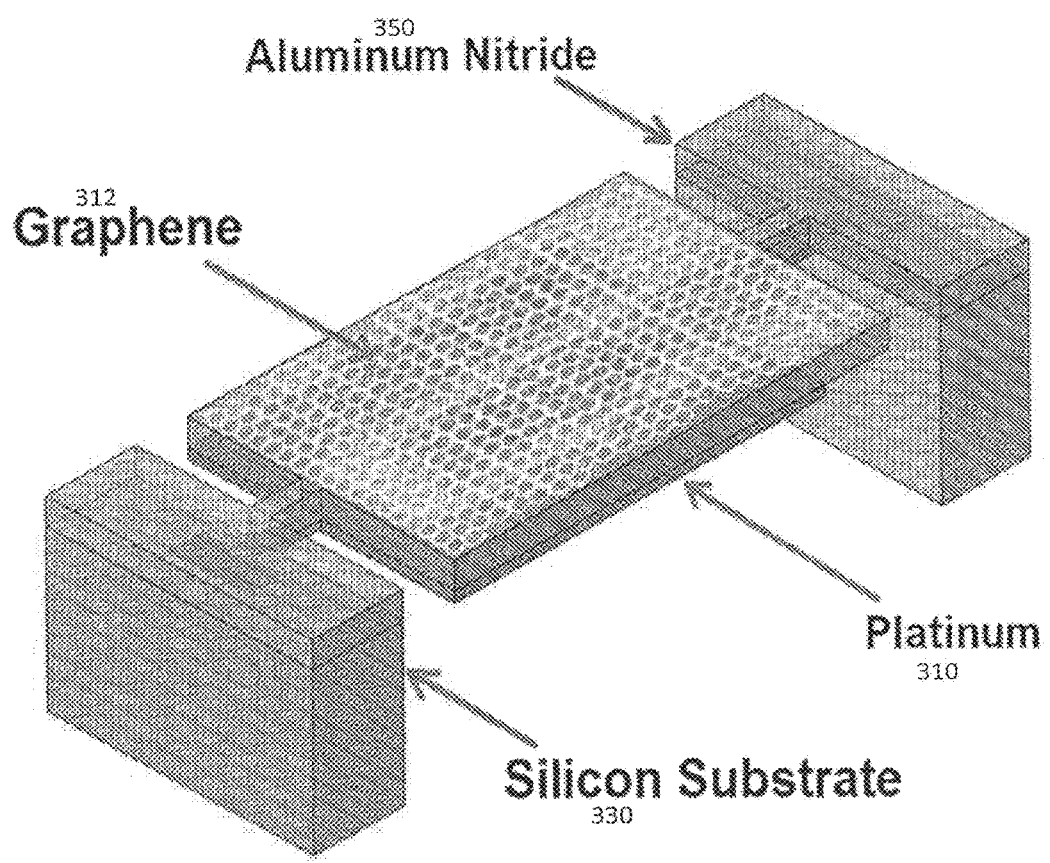
FIG. 20 depicts a schematic representation of a graphene containing AlN resonator, according to one embodiment.

A three-dimensional schematic representation of the G-AlN NPR according to one embodiment is shown in FIG. 20. A high frequency bulk acoustic mode of vibration may be excited into the AlN nano plate by an interdigital bottom electrode 310 and an electrically floating top electrode 312, which acts to confine the excitation field across the thickness of the piezoelectric layer 350. According to another embodiment, a metal-free NPR may be produced by utilizing a 2D electrically active material for both/all electrodes contained within the NPR. In one embodiment, the top electrode, the bottom electrode, or both, may comprise the 2D electrically active material. According to one embodiment, the NPR may not include a metal electrode. According to another embodiment, the NPR contains a metal electrode in addition to the 2D electrically conductive electrode.

The application of an AC voltage to the interdigital electrode 310 may excite a contour-extensional mode of vibration through the equivalent $d_{31}$ piezoelectric coefficient of AlN. In the absence of the electrically conductive top electrode, the excitation electric field may not be effectively confined across the thickness, T, of the device, and the electromechanical coupling coefficient, $k_t^2$, of the nanomechanical structure may approach 0, and it would not be possible to excite the high frequency contour-extensional mode of vibration in such ultra-thin AlN nano-plate. Graphene has not previously been employed as an ultra-thin and light top electrically floating electrode.

Given the equivalent mass density, $\rho_{eq}$, and Young's modulus, $E_{eq}$, of the material stack, including the AlN and electrodes, that forms the resonator, the center frequency, $f_0$, of this laterally vibrating mechanical structure, may be unequivocally set by the pitch, $W_0$, of the interdigital bottom electrode. The resonance frequency of the device may be expressed as $$f_0 = \frac{1}{2W_0}\sqrt{\frac{E_{eq}}{\rho_{eq}}}.$$

Figure 21:
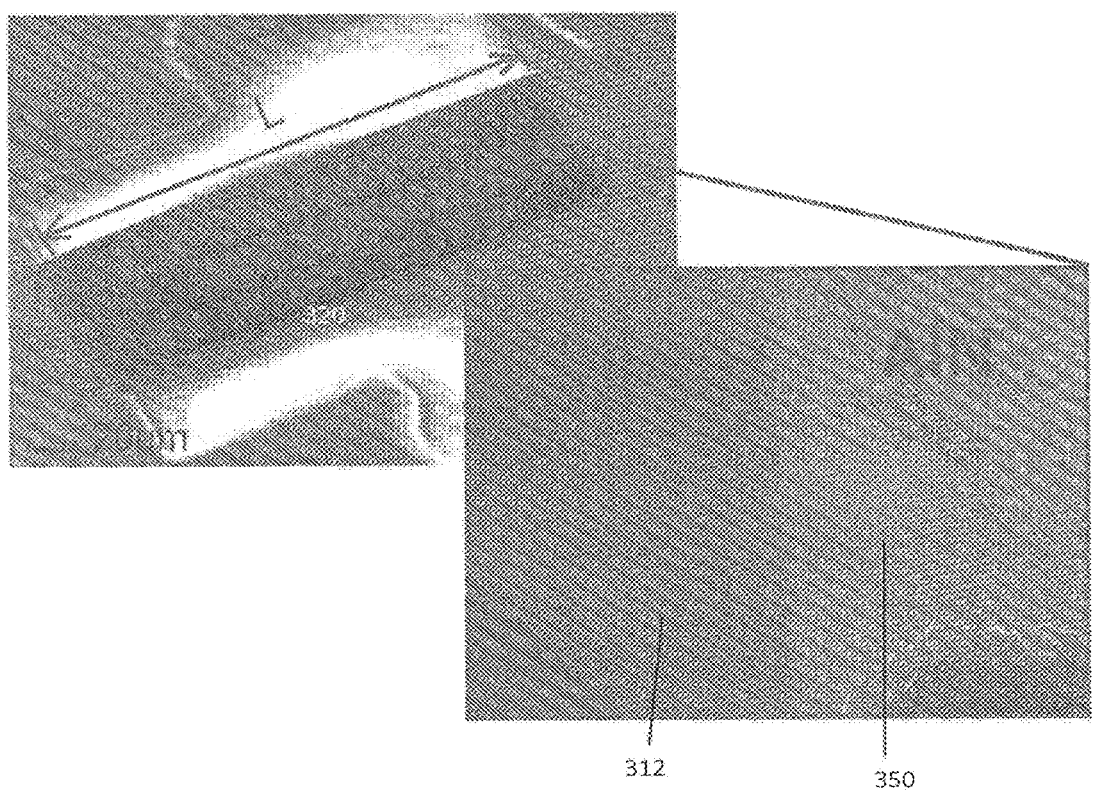
FIG. 21 depicts an SEM image of a graphene containing AlN resonator, according to one embodiment.

The other two geometrical dimensions, thickness, T, and length, L, may help determine the equivalent electrical impedance of the resonator and may be designed independently of the desired resonance frequency. A device with an effective device area of 55 μm (W)×196 μm (L), and the pitch 320, $W_0$, of bottom Platinum (Pt) finger electrode of the device was 20 μm, as shown in FIG. 21, resulting in a high order contour-extensional mode resonator working at high resonance frequency of 245 MHz.

An important parameter for gravimetric sensing applications is the resonator sensitivity, S, to mass per unit area. For a NPR-S loaded on its top surface the sensitivity can be expressed as $$S = -\frac{f_0}{2\rho_{eq}T}.$$

Therefore, the sensitivity, S, of a NPR gravimetric sensor may be improved by increasing the operating frequency of the device and simultaneously reducing its mass density and thickness. Such effective device scaling may be achieved by replacing the heavy and thick top metal electrode utilized in pre-existing sensors with a 2D and ultra-low mass single atomic layer graphene electrode. According to one embodiment, the graphene NPR may have a sensitivity of at least about 40 kHz·µm²/fg—e.g., at least about 50 kHz·µm²/fg, about 55 kHz·µm²/fg, about 60 kHz·µm²/fg, about 65 kHz·µm²/fg, or more.

Table 1 reports the sensitivity, S, in units of kHz·µm²/fg, of the G-AlN NPR and the sensitivity of a pre-existing AlN NPR. The pre-existing AlN NPR was based on the same design as the G-AlN NPR but employed a 100 nm thick gold top electrode instead of the 2D graphene top electrode. Gold is a commonly employed top metal electrode in NEMS resonant sensors because it may be easily functionalized with thiolated ligands. As reported in Table 1, the G-AlN NPR-S exhibits more than a 2 fold improvement in sensitivity as compared to the pre-existing AlN NPR.

TABLE 1

|  | $\rho_{eq}$ (kg · m⁻³) | $E_{eq}$ (GPa) | T (µm) | S |
| --- | --- | --- | --- | --- |
| AlN | 6220 | 350 | 0.65 | 24.7 |
| AlN | 7022 | 348 | 0.70 | 18.1 |
| G-AlN | 4192 | 396 | 0.55 | 53.1 |

The NPR may be fabricated by any suitable fabrication process. According to one embodiment the graphene NPR may be fabricated by a combination of top-down microfabrication techniques (6 masks) and bottom-up growth for graphene. The top-down microfabrication techniques may be carried out in a wafer level process. The bottom-up growth of graphene may be carried out in a die level process. According to one embodiment, the resonator may be fabricated by a process including: disposing a first electrode over a substrate, disposing a piezoelectric layer over the substrate and first electrode, disposing a second electrode including a two-dimensional electrically conductive material over the piezoelectric layer, etching the piezoelectric layer to form a piezoelectric nano-plate and releasing the nano-plate from the substrate. The substrate may be any suitable material, such as silicon. According to one embodiment the substrate may be a silicon wafer. According to one embodiment, the disposing of the piezoelectric layer may include any suitable process, such as a sputter deposition process. The piezoelectric layer may include any suitable material, such as the aforedescribed piezoelectric materials. According to one embodiment, the disposing of the first electrode may include any appropriate process, such as a sputter deposition process. The first electrode may be an interdigital electrode. According to one embodiment, the disposing of the second electrode may include any appropriate process, such as contacting a two-dimensional electrically active material with the piezoelectric layer. According to one embodiment, the etching of the piezoelectric layer to form a piezoelectric nano-plate may include any suitable process, such as an ion conductive plasma (ICP) process. The forming of the nano-plate may include forming a perimeter of the nano-plate. According to one embodiment, the releasing the piezoelectric layer from the substrate may include any suitable process, such as an isotropic etching process.

The two-dimensional electrically conductive material may be formed by any suitable process. According to one embodiment, the two-dimensional electrically conductive material may be produced by a process including: forming the two-dimensional electrically conductive material on a foil substrate, disposing a polymer layer over the two-dimensional electrically conductive material, removing the foil substrate, contacting the two-dimensional electrically conductive material with the piezoelectric layer and dissolving the polymer layer. The foil substrate may be any suitable foil, such as a metal foil, such as a Cu foil. The forming of the two-dimensional electrically conductive material may include any suitable process, such as chemical vapor deposition (CVD). The polymer layer may include any suitable polymer, such as poly-methyl methacrylate (PMMA). According to one embodiment, removing the foil substrate may include any suitable process, such as an etching process. The contacting the two-dimensional electrically conductive material with the piezoelectric layer may include any suitable process, such as placing the two-dimensional electrically conductive material on top of the piezoelectric layer. According to one embodiment, the dissolving the polymer layer may include any suitable process, such as dissolving in acetone.

The fabrication process may additionally include a process to protect the second electrode during the releasing process. According to one embodiment, the additional process may include disposing a thin film including a polymer over the second electrode prior to releasing the nano-plate and removing the thin film after releasing the nano-plate. The thin film may include any suitable polymer material, such as polydimethyl glutarimide (PMGI).

An exemplary G-AlN NPR was fabricated as shown in FIGS. 29(a)-29(e). A high resistivity (>10⁴Ω~cm) silicon (Si) wafer was used as a substrate 330. A 50 nm thick Platinum (Pt) film was sputter-deposited and patterned by lift-off on top of the Si substrate to define the bottom interdigital electrode 310 as shown in FIG. 29(a). Then, a 500 nm AlN film 350 (stress 60 MPa and FWHM2.2°) was sputter-deposited and etched by Inductively Coupled Plasma (ICP) etching in Cl₂ based chemistry to define the perimeter of a resonant nano plate by forming gaps 360 in the MN film. Vias to access the bottom electrode were etched by H₃PO₄, as shown in FIG. 29(b). Then, a 100 nm thick gold (Au) film was sputter-deposited and patterned by lift-off to form probing pads 314 that allow integration of the G-AlN NPR with electrical circuits, as shown in FIG. 29(c).

A macroscopic sheet of graphene was grown directly on a copper (Cu) foil by a chemical vapor deposition (CVD) method. The dimensions of the graphene sheet were limited by the dimensions of the furnace employed in the production of the sheet. The graphene sheet had external dimensions of 1.5×1.5 cm. The graphene sheet was coated with a thin layer of poly-methyl methacrylate (PMMA) and then released from the Cu substrate by etching the Cu substrate with an aqueous iron (III) chloride (FeCl₃) solution. The graphene/PMMA sheet was rinsed in deionized (DI) water and placed on top of the previously processed AlN NEMS die. The transfer of the graphene layer on the AlN NEMS die was completed by dissolving the PMMA in acetone. The graphene layer transferred on top of the AlN NEMS die was then patterned by standard lithography and oxygen plasma etching techniques, to form a graphene top electrode as shown in FIG. 29(d). To avoid unintentional doping of the graphene layer during the final NEMS resonator release step in XeF$_2$ a thin-film of polydimethyl glutarimide (PMGI) polymer was deposited by spin coating on top of the graphene-NEMS die and patterned to protect the graphene electrodes. Finally, the G-AlN NEMS structure was released from the substrate by XeF$_2$ isotropic etching of the silicon to form a release void 365 as shown in FIG. 29(e). The PMGI protective layer was removed with a photoresist solvent.

Figure 22:
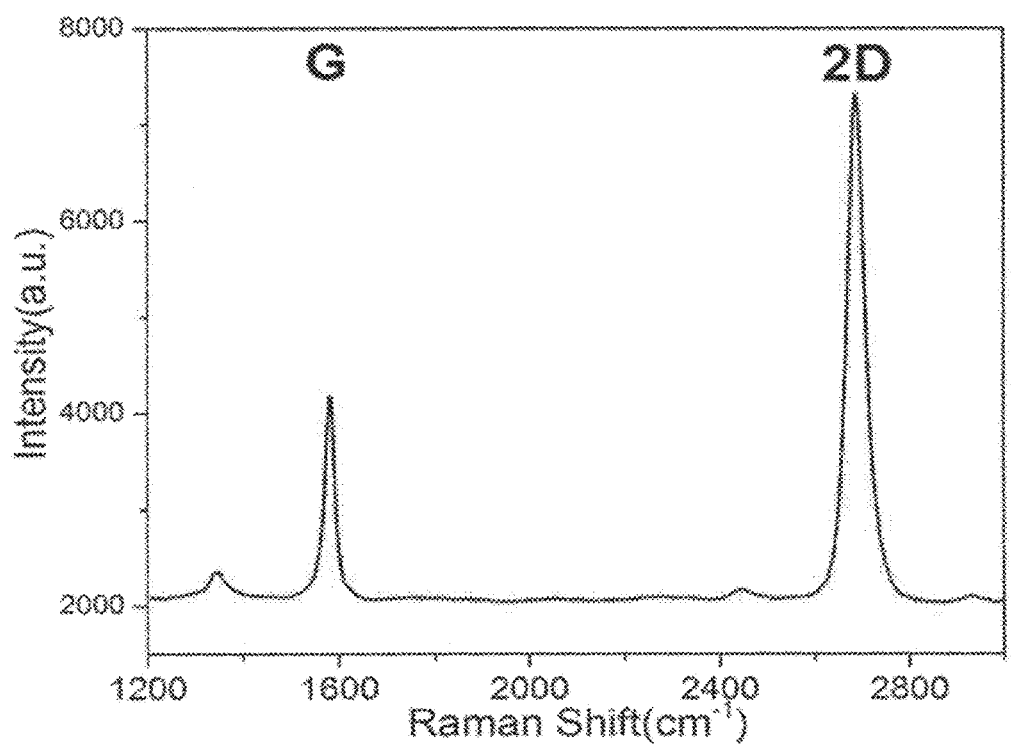
FIG. 22 depicts the Raman spectrum of the graphene contained in graphene containing AlN resonator, according to one embodiment.

High quality graphene was maintained throughout the fabrication process as confirmed by Raman spectrum taken after release of the G-AlN NPR, as shown in FIG. 22. The approximately 0.5 G-to-2D intensity ratio and symmetric 2D band centered at about 2650 cm$^{-1}$ with a full width at half maximum of about 40 cm$^{-1}$ observed are typical features of monolayer graphene.

Figure 23:
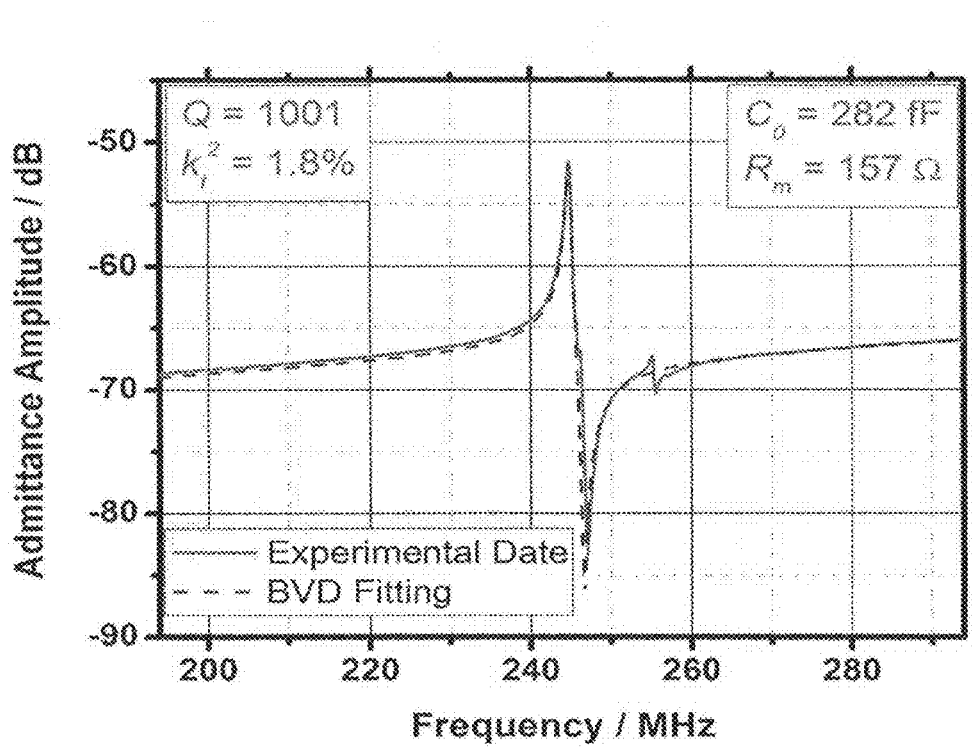
FIG. 23 depicts the admittance amplitude of a graphene containing AlN resonator as a function of frequency, according to one embodiment.
Figure 24:
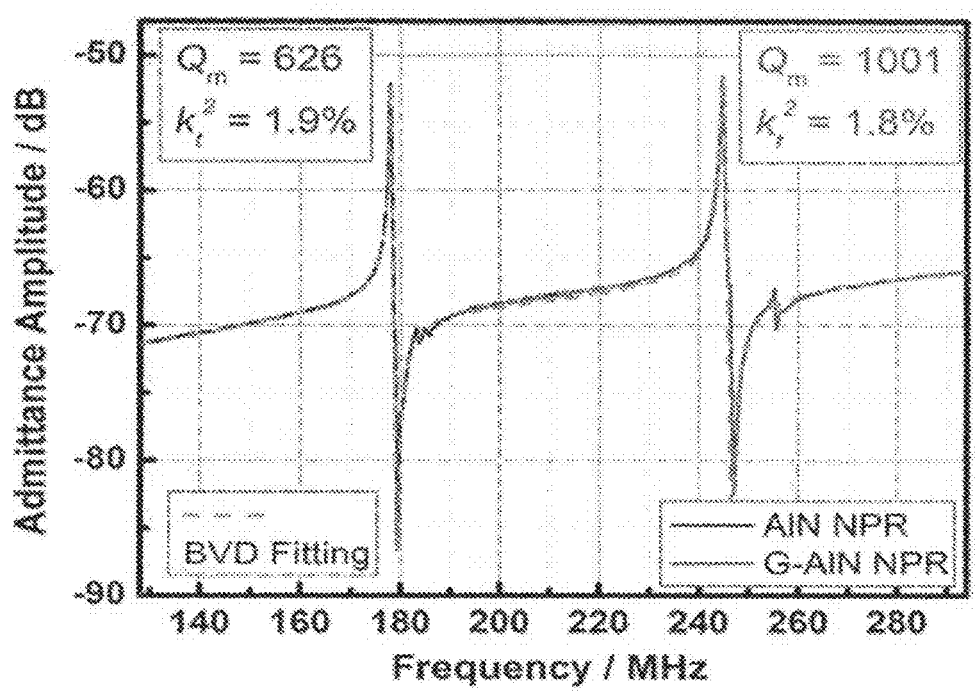
FIG. 24 depicts the admittance amplitude as a function of frequency of a graphene containing AlN resonator and a pre-existing AlN resonator that does not contain graphene, according to one embodiment.

The fabricated G-AlN NPR was tested at room temperature and atmospheric pressure in an RF probe station and its electrical response was measured by an Agilent E5071C network analyzer after performing a short-open-load calibration on a reference substrate. The electromechanical performance of the device was extracted by Butterworth-Van Dyke (BVD) model fitting, as shown in FIG. 23, and compared to a pre-existing AlN NPR that was fabricated on the same substrate and based on the same core design but employed a 100 nm thick gold top electrode instead of the 2D graphene top electrode. As shown in FIG. 24, the measured admittances of the fabricated G-AlN NPR exhibit a higher frequency response than the pre-existing AlN GPR.

Table 2 compares the BVD model fitting parameters of the fabricated G-AlN NPR and the pre-existing AlN NPR. A higher operating frequency and unchanged Figure of Merit, $k_t^2 \cdot Q$, was achieved with the G-AlN NPR. Despite the ultra-reduced volume of the single atomic monolayer 2D graphene electrode, a relatively small and tolerable value of electrical resistance, R$_s$, was introduced compared to the 150 times thicker and 2500 times heavier gold electrode.

TABLE 2

|       | f$_0$    | Q    | k$_t^2$ | C$_0$   | R$_m$ | R$_s$ |
|-------|----------|------|---------|---------|-------|-------|
| AlN   | 200 MHz  | 1015 | 1.81%   | 281 fF  | 189Ω  | 98Ω   |
| AlN   | 178 MHz  | 626  | 1.90%   | 324 fF  | 285Ω  | 128Ω  |
| G-AlN | 245 MHz  | 1001 | 1.81%   | 282 fF  | 157Ω  | 228Ω  |

Despite a mass reduced by about 43% and a volume reduced by about 16%, an increased sound velocity and a resonant frequency increased by about 23%, the G-AlN NPR device exhibited an unchanged Figure of Merit of about 18 compared to the pre-existing AlN NPR device. This experimental result demonstrates that the introduction of the graphene electrode not only enables the fabrication of AlN NPRs with lower volume and mass and improved sensitivity to mass loading but also, despite the volume scaling, allows the achievement of high values of Q (~1000), which guarantee ultra-low noise performance of the sensor. Despite the relatively high sheet resistance of about 1.5 kΩ/□ of the synthesized graphene layer, the 2D graphene electrode introduced only a relatively small and tolerable value of electrical resistance, R$_S$, compared to a 250 times thicker and 3750 times heavier gold electrode. It is worth noting that a much lower sheet resistance of about 60Ω/□ can be achieved in commercially available graphene which would further reduce the electrical loading of the graphene electrode to less than about 2% of the total loss of the system. The reduced mass and volume, and the increased frequency of operation of such G-AlN NPRs combined with their high Q values demonstrate the great potential of the proposed technology for the implementation of a new class of resonant sensors capable of achieving unprecedented values of limit of detection and detection speed.

Figure 25:
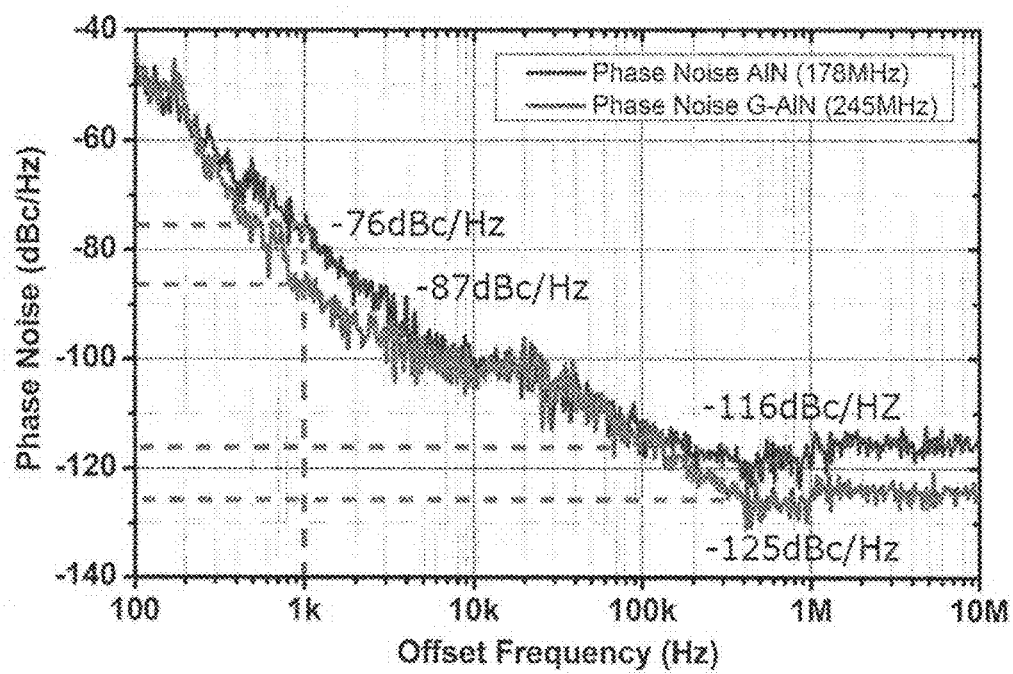
FIG. 25 depicts the phase noise as a function of offset frequency of a graphene containing AlN resonator and a pre-existing AlN resonator that does not contain graphene, according to one embodiment.
Figure 30:
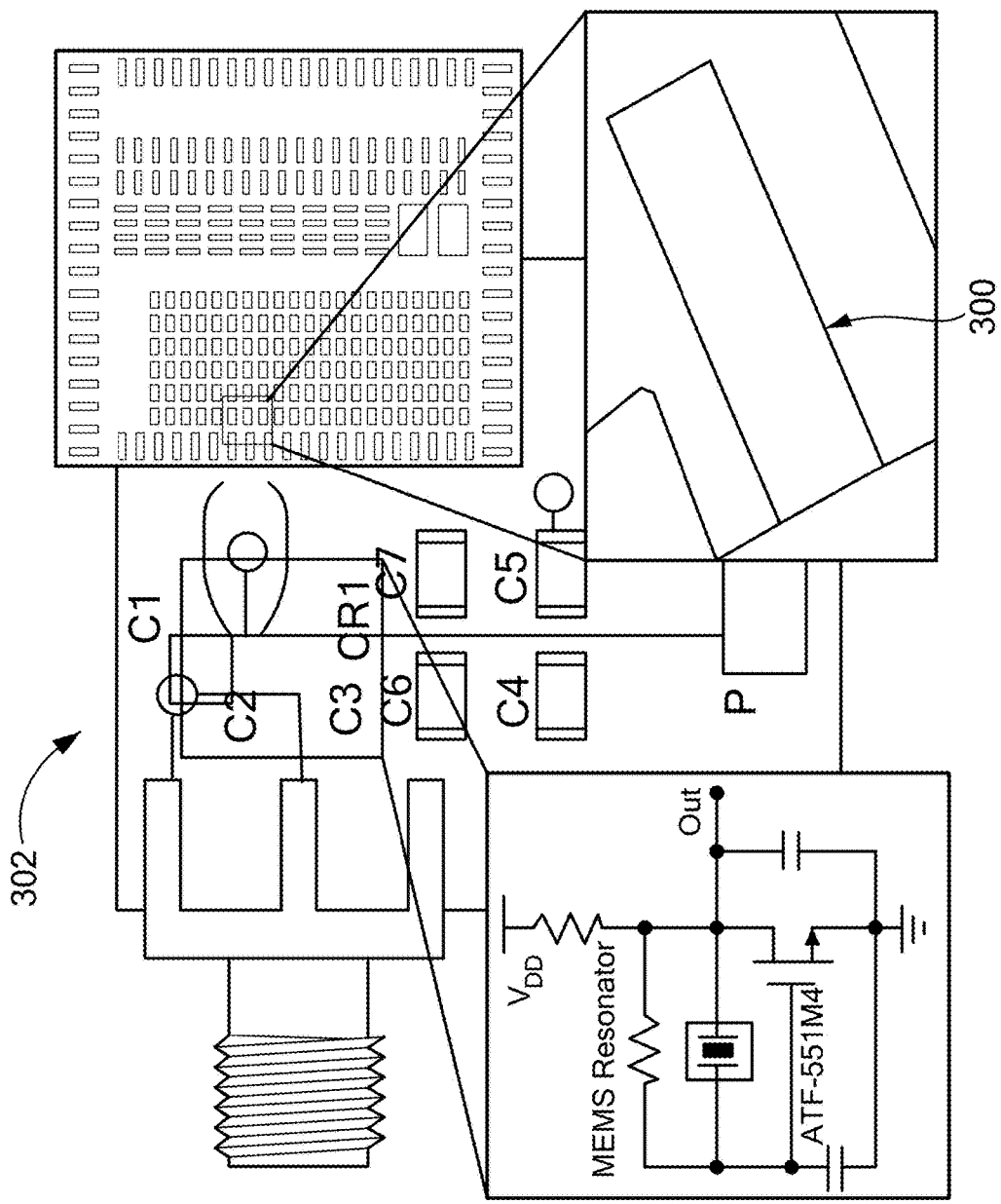
FIG. 30 depicts an oscillator circuit containing a graphene containing AlN resonator, according to one embodiment.

The fabricated G-AlN NPR and the pre-existing AlN NPR were directly wire-bonded to Pierce oscillator circuits implemented with an ATF-551M4 E-pHEMT GaAs transistor. The resulting oscillator circuit 302 containing the G-AlN NPR 300 is shown in FIG. 30. The phase noise was measured for best bias conditions using an Agilent N9010A EXA signal analyzer. Despite the 250 fold smaller volume of the top electrode and the 38% higher operating frequency, improved phase noise performance was recorded for the G-AlN device due to its higher mechanical Q. The measured phase noise performance the oscillator circuits is shown in FIG. 25.

The electrical conductivity of the graphene electrode may be switched as the result of the application of a DC bias or control signal. According to one embodiment, the DC bias may be applied to a gate of the interdigital electrode. The control signal may include a radio frequency signal. According to one embodiment, the operation of the NPR may include application of a DC bias or control signal to the two-dimensional electrically conductive material. After the application of a DC bias or control signal to the two-dimensional electrically conductive material, the NPR may exhibit no mechanical resonance. According to one embodiment, after the application of a DC bias or control signal to the two-dimensional electrically conductive material, the electromechanical coupling coefficient of the NPR may be about 0. The switching of the two-dimensional electrically conductive material may be reversible. According to one embodiment, the switching of the resonator may be reversed by applying at least one of a different DC bias and a different control signal to the two-dimensionally electrically active material of the resonator. According to one embodiment, the switching of the resonator may not include the operation of a mechanical switch. The switching may produce the desired change in the conductivity of the graphene electrode in a response time of about a microsecond, or less.

FIG. 31(a) illustrates the operational mode of a NPR resonator including a 2D electrically conductive electrode in a conductive state, according to one embodiment. The NPR may include a piezoelectric material 350, positive electrodes 345 and a negative electrode 340. The application of a voltage across the positive electrodes 345 and the negative electrode 340 may produce an electric field 315 within the piezoelectric material 350, resulting in a piezo-induced strain 325 in the piezoelectric material 350. FIG. 31(b) illustrates a similar NPR resonator including a 2D electrically conductive electrode in a non-conductive, insulating, state, according to one embodiment. The insulating electrode 395 may not produce an electric field 315 within the piezoelectric material 350 upon application of a voltage across the positive electrodes 345 and the negative electrode 340 that is capable of producing a piezoelectric strain, and thus the NPR with an electrode in an insulating state may not produce the resonant behavior exhibit by a NPR with an electrode in a conductive state.

Figure 26:
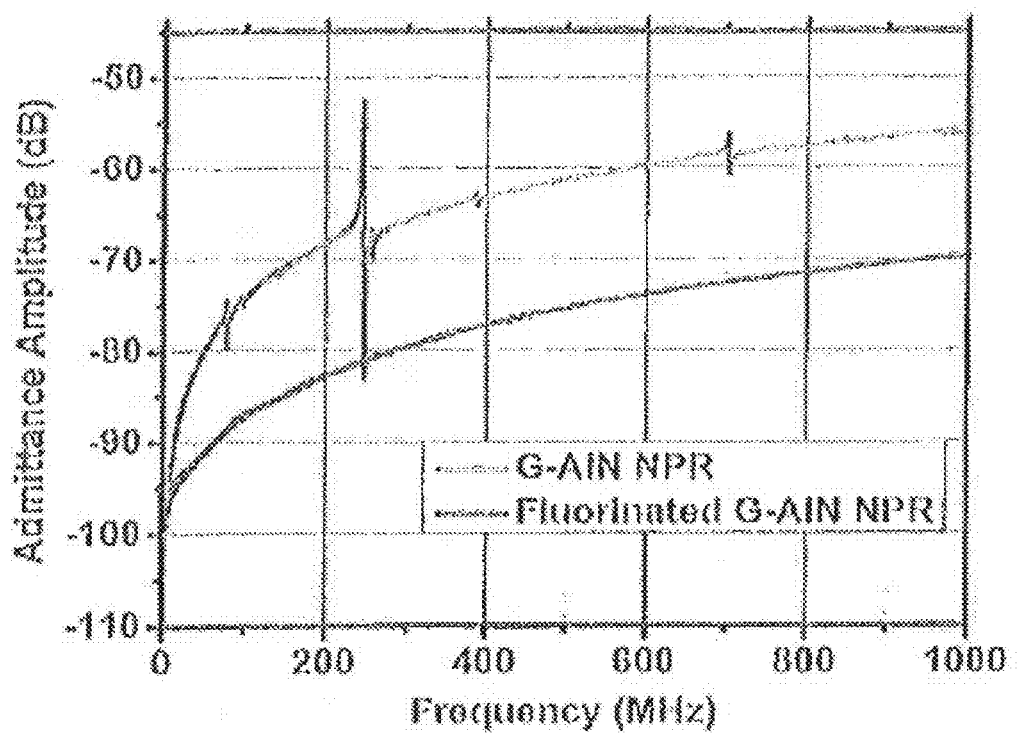
FIG. 26 depicts the admittance amplitude as a function of frequency of a graphene containing AlN resonator and a fluorinated graphene containing AlN resonator, according to one embodiment.
Figures 27, 28:
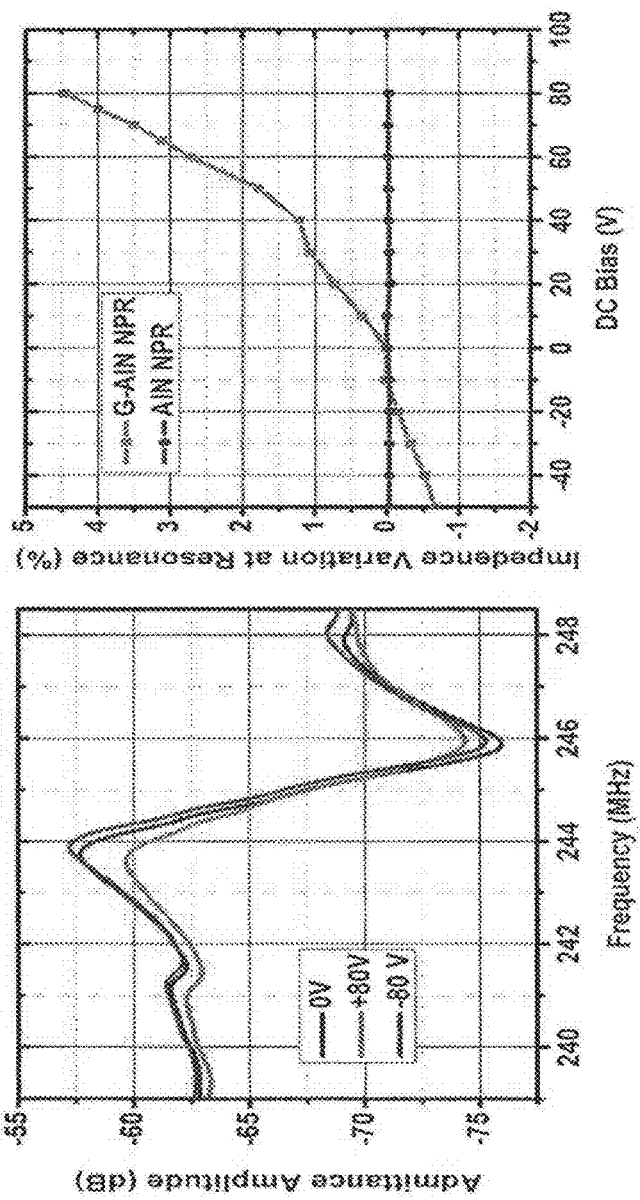
FIG. 27 depicts the admittance amplitude as a function of frequency of a graphene containing AlN resonator subjected to a variety of bias voltages, according to one embodiment.
FIG. 28 depicts the impedance variation at resonance as a function of DC bias of a graphene containing AlN resonator and a pre-existing AlN resonator that does not contain graphene, according to one embodiment.

In one example, a graphene electrode containing MN NPR was fluorinated with xenon difluoride (XeF$_2$) gas to increase the resistivity of the graphene layer by doping. Doping of a graphene layer may produce an increase in resistivity of up to 6 times in comparison to a non-doped graphene layer. A comparison of the operation of the undoped G-AlN NPR and the fluorinated G-AlN NPR is shown in FIG. 26. Additionally, the tuning of graphene conductivity as a result of the application of a DC control bias has been demonstrated. As shown in FIGS. 27 and 28, the application of a DC control bias to the graphene electrode changes the resistivity of the graphene electrode and alters the resonance behavior of the G-AlN NPR. The application of a DC bias may produce up to a 30 fold increase or decrease of the electrical conductivity of a graphene electrode. The switching effect produced by the application of a DC control bias may be reversible.

Tuning the electrical conductivity of the 2D electrically conductive electrode material allows the control of the electromechanical coupling of the G-AlN NPR and implementation of banks of multi frequency resonators and filters in electrically programmable matrices that do not require mechanical switches in the RF line. This out-of-line switching capability may reduce the capacitive loading of turned off resonators or filters in the bank. According to one embodiment, the switching of the resonator may allow the input/output capacitance of the resonator to be reduced and/or eliminated when not in use. The input/output capacitance may be reduced by more than 3 orders of magnitude. In effect, the resonators may be switched on and off by controlling the electromechanical coupling factor. This allows individual resonators in a filter bank to switched on and off by individually controlling the electromechanical coupling factor. By introducing an electrode with tunable conductivity, such as graphene, it is possible to develop a new class of MEMS resonators in which the electromechanical coupling coefficient, $k_t^2$ can be switched on and off by applying a DC bias or a control signal. According to one embodiment, the conductivity of the electrode may be tuned to create an effective open circuit within the resonator. Additionally, the out-of-line switching enabled by the switching processes described herein reduces resistive losses in the RF signal line, producing improved receiver performance.

ADDITIONAL NOTES

The various embodiments herein may be combined. For example, a radiation detector may include a resonator with a 2D electrically conductive material or combined mode resonator.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." Any ranges cited herein are inclusive.

The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" may refer, according to one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of"

"Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, according to one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein "at %" refers to atomic percent and "wt %" refers to weight percent. However, in certain embodiments when "at %" is utilized the values described may also describe "wt %." For example, if "20 at %" is described according to one embodiment, in other embodiments the same description may refer to "20 wt %." As a result, all "at %" values should be understood to also refer to "wt %" in some instances, and all "wt %" values should be understood to refer to "at %" in some instances.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. A radiation detector comprising:
   a resonator comprising:
      a piezoelectric plate, and
      an interdigital electrode disposed on a first surface of the piezoelectric plate, and
   an absorber layer disposed above a second surface of the piezoelectric plate opposing the first surface, wherein the absorber layer is capable of absorbing at least one of infrared and terahertz radiation.

2. The detector of claim 1, wherein the detector is capable of room temperature operation.

3. The detector of claim 1, wherein a contour-mode of vibration is excited in the piezoelectric plate in response to an alternating current (AC) applied through the electrode.

4. The detector of claim 1, wherein the absorber layer comprises at least one of a single wall carbon nanotube forest, silicon nitride, graphene, and photonic meta-materials.

5. The detector of claim 1, wherein a temperature coefficient of frequency of the resonator is less than about −30 ppm/K.

6. The detector of claim 1, wherein the absorber layer contacts the second surface of the piezoelectric plate.

7. The detector of claim 1, wherein the absorber layer and the second surface of the piezoelectric late are separated by an air gap.

8. The detector of claim 1, further comprising a complementary metal-oxide-semiconductor circuit configured to provide an electronic readout of a resonance frequency of the resonator.

9. The detector of claim 1, wherein the piezoelectric plate comprises at least one of aluminum nitride, lithium niobate, lithium tantalite, zinc oxide, gallium nitride and quartz.

* * * * *